US011942527B2

(12) United States Patent
Chen et al.

(10) Patent No.: US 11,942,527 B2
(45) Date of Patent: *Mar. 26, 2024

(54) FORMING A CAVITY WITH A WET ETCH FOR BACKSIDE CONTACT FORMATION

(71) Applicant: Taiwan Semiconductor Manufacturing Company, Ltd., Hsinchu (TW)

(72) Inventors: Yi-Hsiu Chen, Taipei (TW); Andrew Joseph Kelly, Hengshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/873,210

(22) Filed: Jul. 26, 2022

(65) Prior Publication Data

US 2022/0359689 A1 Nov. 10, 2022

Related U.S. Application Data

(63) Continuation of application No. 17/097,468, filed on Nov. 13, 2020, now Pat. No. 11,437,480.

(51) Int. Cl.
*H01L 29/417* (2006.01)
*H01L 21/306* (2006.01)
(Continued)

(52) U.S. Cl.
CPC .. *H01L 29/41791* (2013.01); *H01L 21/30608* (2013.01); *H01L 29/0847* (2013.01);
(Continued)

(58) Field of Classification Search
CPC ............ H01L 29/785; H01L 29/42392; H01L 29/41791; H01L 21/30608; H01L 29/0847;
(Continued)

(56) References Cited

U.S. PATENT DOCUMENTS 11,437,480 B2 * 9/2022 Chen ................... H01L 29/0847
2019/0057867 A1 * 2/2019 Smith ................. H01L 29/0669
(Continued)

OTHER PUBLICATIONS

Non-Final Office Action dated Jan. 21, 2022 for U.S. Appl. No. 17/097,468.
(Continued)

*Primary Examiner* — Changhyun Yi
(74) *Attorney, Agent, or Firm* — Eschweiler & Potashnik, LLC

(57) ABSTRACT

In some embodiments, the present disclosure relates to an integrated chip that includes a channel structure extending between a first source/drain region and a second source/drain region. Further, a gate electrode is arranged directly over the channel structures, and an upper interconnect contact is arranged over and coupled to the gate electrode. A backside contact is arranged below and coupled to the first source/drain region. The backside contact has a width that decreases from a bottommost surface of the backside contact to a topmost surface of the backside contact.

20 Claims, 22 Drawing Sheets

(51) Int. Cl.
    *H01L 29/06*    (2006.01)
    *H01L 29/08*    (2006.01)
    *H01L 29/423*   (2006.01)
    *H01L 29/66*    (2006.01)
    *H01L 29/78*    (2006.01)
    *H01L 29/786*   (2006.01)

(52) U.S. Cl.
    CPC .... *H01L 29/66545* (2013.01); *H01L 29/0673* (2013.01); *H01L 29/42392* (2013.01); *H01L 29/66742* (2013.01); *H01L 29/66795* (2013.01); *H01L 29/785* (2013.01); *H01L 29/78696* (2013.01)

(58) Field of Classification Search
    CPC ........... H01L 29/66545; H01L 29/0673; H01L 29/66742; H01L 29/66795; H01L 29/78696; H01L 29/0665
    See application file for complete search history.

(56) References Cited

U.S. PATENT DOCUMENTS

| | | | | |
|---|---|---|---|---|
| 2020/0176335 A1* | 6/2020 | Cheng | ................. | H01L 27/0924 |
| 2020/0294998 A1* | 9/2020 | Lilak | ................. | H01L 23/53295 |
| 2021/0384299 A1 | 12/2021 | Ma et al. | | |
| 2021/0408246 A1* | 12/2021 | Ganguly | ........... | H01L 21/02532 |

OTHER PUBLICATIONS

Notice of Allowance dated Apr. 29, 2022 for U.S. Appl. No. 17/097,468.

\* cited by examiner

US 11,942,527 B2

FORMING A CAVITY WITH A WET ETCH FOR BACKSIDE CONTACT FORMATION

REFERENCE TO RELATED APPLICATION

This application is a Continuation of U.S. application Ser. No. 17/097,468, filed on Nov. 13, 2020, the contents of which are hereby incorporated by reference in their entirety.

BACKGROUND

As technology advances at a rapid pace, engineers work to make devices smaller, yet more complex, to improve and develop electronic devices that are more efficient, more reliable, and have more capabilities. One way to achieve these goals is by improving the design of transistors, as electronic devices comprise a plethora of transistors that together, carry out the function of the device. Overall electronic device performance may benefit from transistors that, for example, are smaller in the horizontal and vertical directions, consume less power, and have faster switching speeds.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
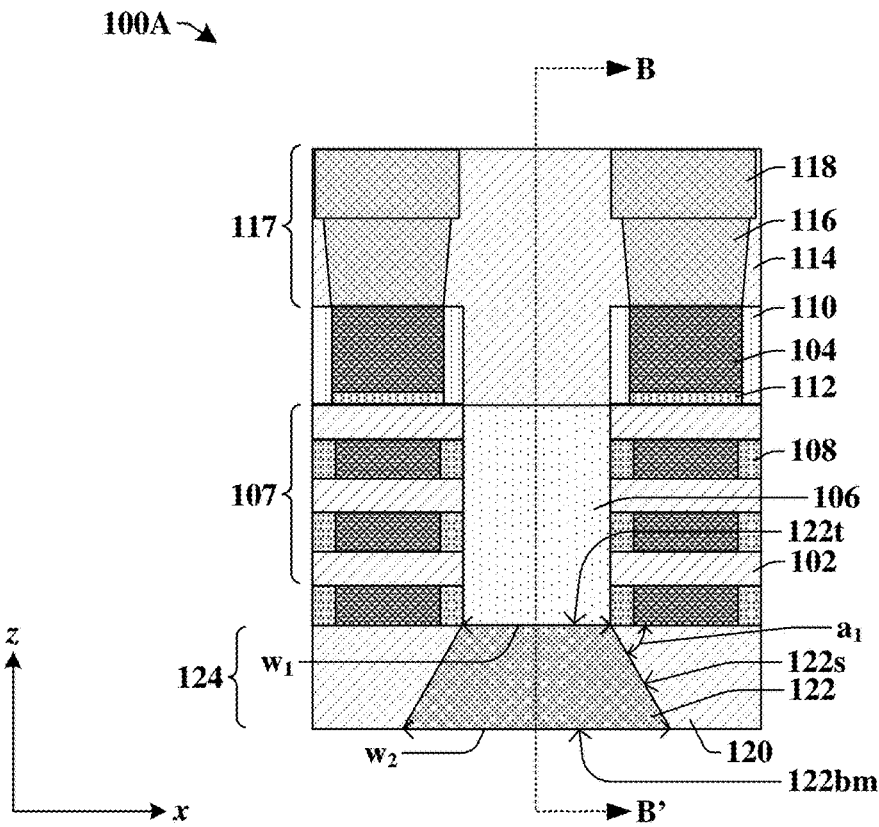
FIG. 1A illustrates a cross-sectional view of some embodiments of an integrated chip having a nanosheet field effect transistor (NSFET) that comprises a backside contact arranged below and coupled to a source/drain region, wherein the backside contact has a bottommost surface that is wider than a topmost surface.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip may comprise, in some embodiments, a transistor device arranged over a substrate. In some configurations, to increase device density on the substrate, the transistor device may comprise, for example, a nanosheet field effect transistor (NSFET), a fin field effect transistor (finFET), or some other type of transistor. As transistor devices reduce in size to increase device density, an interconnect structure may be formed on a frontside of the substrate over the transistor device, and then, a backside of the substrate may be patterned to form a backside contact coupled to one or more components (e.g., source/drain regions, gate electrode) of the transistor device. Some advantages of using the frontside and the backside of the transistor device include, for example, an increase in device density, a reduction in capacitance/cross-talk between conductive features, and the ability to use both sides of the transistor device in packaging.

In some instances, during the formation of a transistor device over a frontside of a substrate, a first removal process is performed to form a trench within a semiconductor material to define channel structures. To accommodate a backside contact on the source/drain region, the trench extends further below the channel structures such that a lower portion of the trench is arranged below the channel structures, and an upper portion of the trench is arranged between the channel structures. A dummy source/drain material is formed within the lower portion of the trench, and a source/drain region is formed within the upper portion of the trench. After the formation of the transistor device and a frontside interconnect structure arranged over the transistor device, a backside of the substrate is thinned to expose a surface of the dummy source/drain material within the lower portion of the trench. Then, the dummy source/drain material is removed and replaced by a conductive material within the lower portion of the trench, thereby forming a backside contact coupled to the source/drain region. However, the lower portion of the trench has a width that increases from the backside of the transistor device towards the frontside of the transistor device, which may cause voids to form within the backside contact upon deposition of the conductive material within the lower portion of the trench.

Various embodiments of the present disclosure are directed towards performing a second removal process after the first removal process to form a wide cavity below the channel structures. Thus, in some embodiments, the first removal process forms a trench that defines channel structures of the transistor device. After the first removal process, a second removal process is performed using a wet etch to form a cavity below and connected to the trench. The wet etch of the second removal process removes portions of the substrate in the vertical and horizontal directions such that the cavity has a larger maximum width than the trench. In some embodiments, the backside of the substrate is later thinned such that the exposed surface of the dummy source/drain material is the widest surface of the remaining dummy source/drain material. This way, when the dummy source/drain material is removed, a backside opening extends from a backside of the transistor device towards the source/drain region. Further, the backside opening has a width that decreases from the backside of the transistor device towards the source/drain region. In such embodiments, a conductive material is formed within the backside opening to form a backside contact coupled to the source/drain region. Because the backside opening has a width that decreases from the backside of the transistor device towards the source/drain region, voids and/or seams are mitigated in the backside contact which increases reliability of the backside contact and thus, overall transistor device.

FIG. 1A illustrates a cross-sectional view 100A of some embodiments of an integrated chip comprising a nanosheet field effect transistor (NSFET) that comprises a backside contact.

The integrated chip of the cross-sectional view 100A is on an xz-plane and includes a source/drain region 106 arranged between channel structures 107. In some embodiments, a gate electrode 104 is arranged over the channel structures 107. In some embodiments, each channel structure 107 comprises multiple nanosheet channel structures 102, wherein the gate electrode 104 is arranged above and below each nanosheet channel structures 102. In some embodiments, a gate dielectric layer 112 is arranged between the gate electrode 104 and the channel structure 107. In some embodiments (not shown), the gate dielectric layer 112 is also arranged between lower portions of the gate electrode 104 and each nanosheet channel structure 102. In some embodiments, inner gate spacer structures 108 are arranged directly between the nanosheet channel structures 102 in the z-direction and surrounding outer sidewalls of the gate electrode 104 in the x-direction. In some embodiments, upper gate spacer structures 110 are arranged on outer sidewalls of the gate electrode 104 arranged over the channel structures 107.

In some embodiments, an upper interconnect structure 117 is arranged over the gate electrode 104. In some embodiments, the upper interconnect structure 117 comprises an interconnect contact 116 and an interconnect conductive structure 118 embedded in an upper interconnect dielectric structure 114. In some embodiments, the upper interconnect structure 117 is electrically coupled to the gate electrode 104. In some embodiments, the interconnect contact 116 comprises a topmost surface that is wider than a bottommost surface. In some embodiments, the interconnect conductive structure 118 is, for example, another interconnect contact, an interconnect wire, an interconnect via, or the like.

In some embodiments, the source/drain region 106 extends in the z-direction from the upper interconnect structure 117 to a lower interconnect structure 124. In some embodiments, the lower interconnect structure 124 comprises a backside contact 122 that is surrounded by a lower interconnect dielectric structure 120 and that is electrically coupled to the source/drain region 106. In some embodiments, by forming a lower interconnect structure 124 on the NSFET, device density may be increased and electrical isolation between the backside contact 122 and the gate electrode 104, the interconnect contact 116, and/or the interconnect conductive structure 118 may be increased. In some embodiments, the backside contact 122 has a topmost surface 122t that has a first width $w_1$ measured in the x-direction and a bottommost surface 122bm that has a second width $w_2$ measure in the x-direction. In some embodiments, the first width $w_1$ is a minimum width of the backside contact 122, and the second width $w_2$ is a maximum width of the backside contact 122. Thus, the second width $w_2$ is greater than the first width $w_1$. Further, in some embodiments, the topmost surface 122t of the backside contact 122 is coupled to the bottommost surface 122bm of the backside contact 122 through outermost sidewalls 122s of the backside contact 122. In some embodiments, the outermost sidewalls 122s of the backside contact 122 are substantially flat or planar.

In some embodiments, the first width $w_1$ may be in a range of between, for example, approximately 10 nanometers and approximately 75 nanometers. In some embodiments, the second width $w_2$ may be in a range of between, for example, approximately 20 nanometers and approximately 80 nanometers. Further, in some embodiments, the outermost sidewalls 122s may be arranged at a first angle $a_1$ measured between the outermost sidewall 122s of the backside contact 122 and a bottommost surface of the gate electrode 104. In some embodiments, the first angle $a_1$ is an acute angle (e.g., less than 90 degrees). In some embodiments, the first angle $a_1$ may be in a range of between, for example, approximately 40 degrees and approximately 60 degrees. In some embodiments, the backside contact 122 may have a height measured in the z-direction between the topmost and bottommost surfaces 122t, 122bm that is in a range of between, approximately 10 nanometers and approximately 40 nanometers, for example.

Further, in some embodiments, a width of the backside contact 122 continuously decreases as the width of the backside contact 122, which is measured in the x-direction, is measured from the bottommost surface 122bm of the backside contact 122 towards the topmost surface 122t of the backside contact 122 in the z-direction. In some embodiments, to form the backside contact 122, a conductive material is formed within a backside opening in the lower interconnect dielectric structure 120. The backside opening has a same profile as the backside contact 122 and thus, has a continuously decreasing width measured in the z-direction from the lower interconnect dielectric structure 120 towards the upper interconnect dielectric structure 114. In some embodiments, the backside opening may be formed using a wet etch prior to the formation of the source/drain region 106. The wet etch may widen the backside opening. Because a width of the backside contact 122 continuously decreases as the width of the backside contact 122 is measured from the bottommost surface 122bmm of the backside contact 122 towards the topmost surface 122t of the backside contact, the backside contact 122 is formed without or with a reduced number of voids and/or seams. Thus, the NSFET may comprise an upper interconnect structure 117 and a lower interconnect structure 124 to save space in the x-direction, thereby increasing device density of the NSFET, with mitigated reliability issues in the backside contact 122.

Figure 1B:
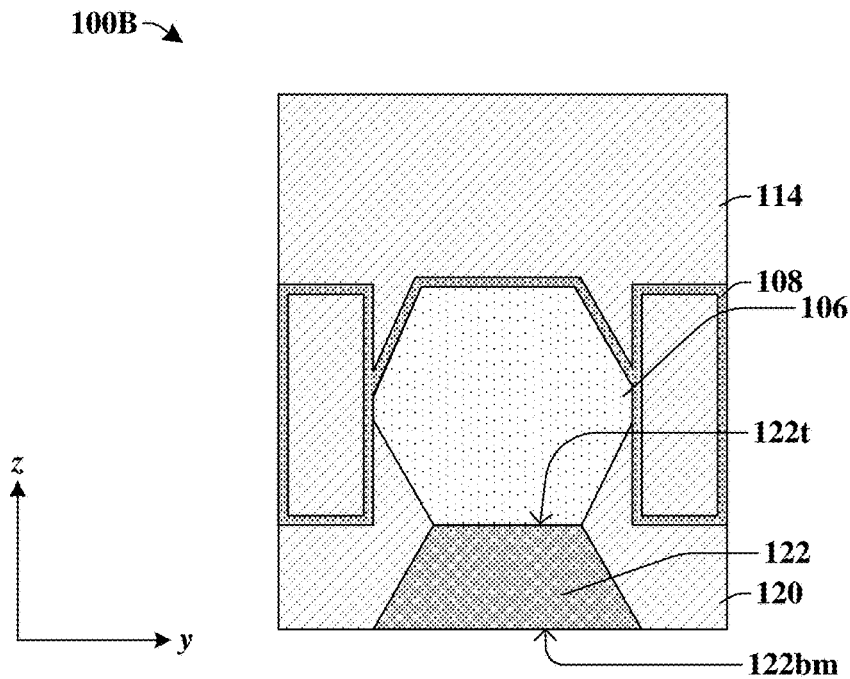
FIG. 1B illustrates a cross-sectional view that corresponds to the integrated chip of FIG. 1A from a different perspective.

FIG. 1B illustrates a cross-sectional view 100B of some embodiments of the NSFET of FIG. 1A on a yz-plane. In some embodiments, the cross-sectional view 100B of FIG. 1B corresponds to cross-section line BB' of FIG. 1A.

In some such embodiments, the backside contact 122 may still have a trapezoidal-like shape on the yz-plane, wherein the topmost surface 122t of the backside contact 122 is narrower than the bottommost surface 122bm of the backside contact 122. In some embodiments, the yz-plane is substantially perpendicular to the xz-plane of FIG. 1A. In some embodiments, the inner gate spacer structure 108 is arranged on upper surfaces of the source/drain region 106 and may laterally surround the source/drain region 106. In some embodiments, the source/drain region 106 has a substantially hexagonal profile from the yz-plane. In some other embodiments, the source/drain region 106 has a different shaped profile from the yz-plane such as, for example, an octagon, a diamond, a pentagon, or the like. Nevertheless, it will be appreciated that the source/drain region 106 may exhibit a different shape when viewing the NSFET from a yz-plane versus an xz-plane.

Figure 2A:
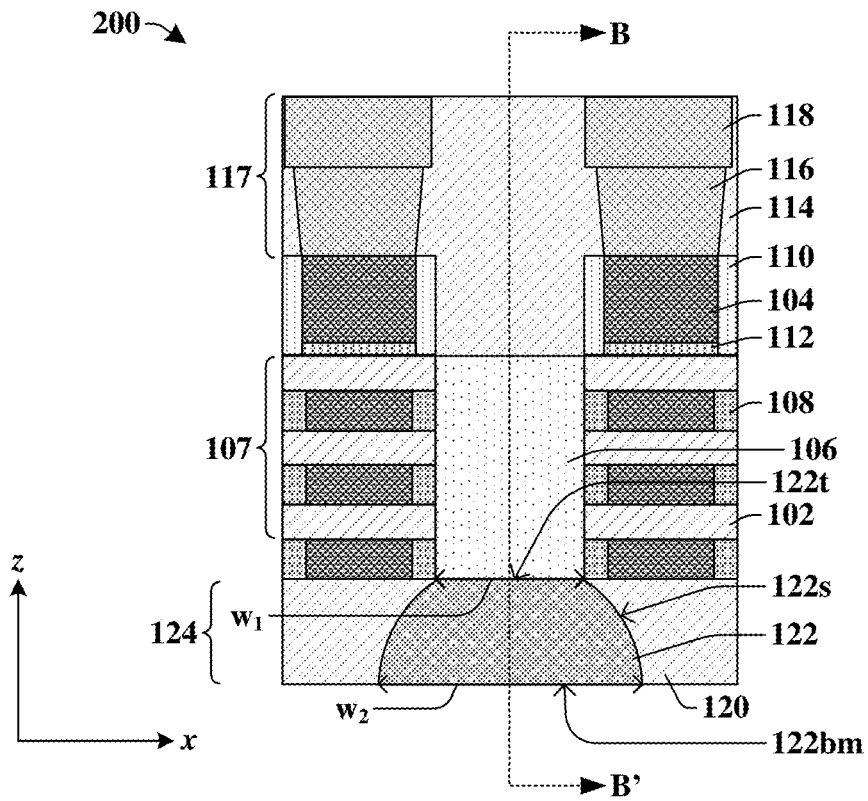
FIG. 2A illustrates a cross-sectional view of some other embodiments of an integrated chip having a NSFET comprising a backside contact that is arranged below and coupled to a source/drain region, wherein the backside contact has a bottommost surface that is wider than a topmost surface.

FIG. 2A illustrates a cross-sectional view 200A of some other embodiments of an integrated chip comprising a nanosheet field effect transistor (NSFET) that comprises a backside contact.

In some embodiments, the outermost sidewalls 122s of the backside contact 122 may be substantially rounded. In some embodiments, the outermost sidewalls 122s may be concave down with respect to the xz-axis. In some embodiments, a width of the backside contact 122 still continuously decreases as the width of the backside contact 122, which is measured in the x-direction, is measured from the bottommost surface 122bm of the backside contact 122 towards the topmost surface 122t of the backside contact 122 in the z-direction. In some embodiments, the first width $w_1$ may be in a range of between, for example, approximately 10 nanometers and approximately 90 nanometers. In some embodiments, the second width $w_2$ may be in a range of between, for example, approximately 20 nanometers and approximately 100 nanometers. It will be appreciated, as further described in FIGS. 11A and 11B of the method, that the various shapes of the backside contact 122 are due to different wet etchants used to form the backside opening.

Figure 2B:
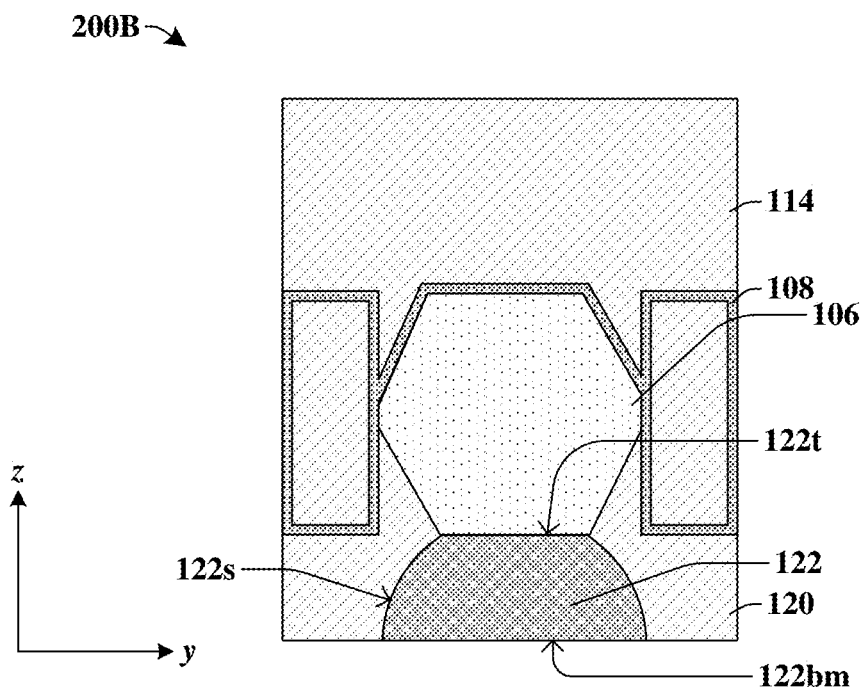
FIG. 2B illustrates a cross-sectional view that corresponds to the integrated chip of FIG. 2A from a different perspective.

FIG. 2B illustrates a cross-sectional view 200B of some embodiments of the NSFET of FIG. 2A on a yz-plane. In some embodiments, the cross-sectional view 200B of FIG. 2B corresponds to cross-section line BB' of FIG. 2A.

In some such embodiments, the backside contact 122 may still have outermost sidewalls 122s that are substantially rounded and coupled the topmost surface 122t to the bottommost surface 122bm of the backside contact 122 on the yz-plane. Further, from the yz-plane, in some embodiments, the topmost surface 122t of the backside contact 122 is still narrower than the bottommost surface 122bm of the backside contact 122.

Figure 3A:
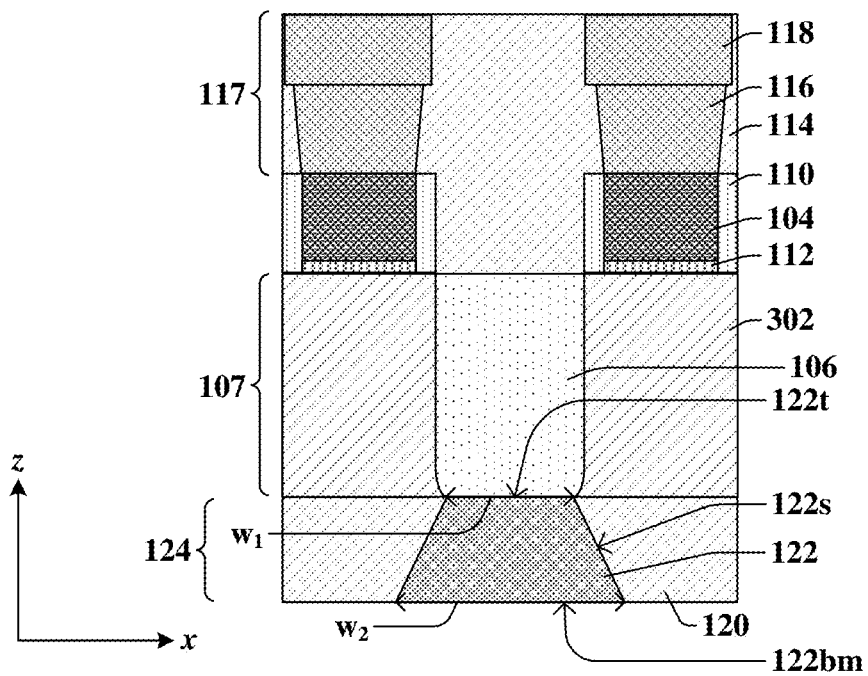
FIGS. 3A and 3B illustrate cross-sectional views of some embodiments of an integrated chip having a fin field effect transistor (finFET) that comprises a backside contact arranged below and coupled to a source/drain region, wherein the backside contact has a bottommost surface that is wider than a topmost surface.

FIG. 3A illustrates a cross-sectional view 300A of some embodiments of an integrated chip comprising a fin field effect transistor (finFET) that comprises a backside contact.

In some other embodiments, the channel structures 107 that surround the source/drain region 106 may be fin structures 302. In some embodiments, the fin structures 302 extend from the lower interconnect dielectric structure 120 to the gate electrode 104 in the z-direction. In some embodiments, the backside contact 122 may still be arranged below and coupled to the source/drain region 106. In some embodiments, the backside contact 122 has a trapezoidal-like shape as described in FIG. 1A, for example.

In some embodiments, the channel structures 107 may comprise a first semiconductor material, and the source/drain region 106 may comprise a second semiconductor material that is different than the first semiconductor material. In some embodiments, for example, the first semiconductor material comprises polysilicon, germanium, or the like, and the second semiconductor material comprises silicon germanium, for example. In some embodiments, the backside contact 122 may comprise a conductive material such as, for example, tungsten, ruthenium, aluminum, copper, or some other suitable conductive material. In some embodiments (not shown), liner and/or barrier layers may be arranged between the backside contact 122 and the lower interconnect dielectric structure 120 and/or between the backside contact 122 and the source/drain region 106.

Figure 3B:
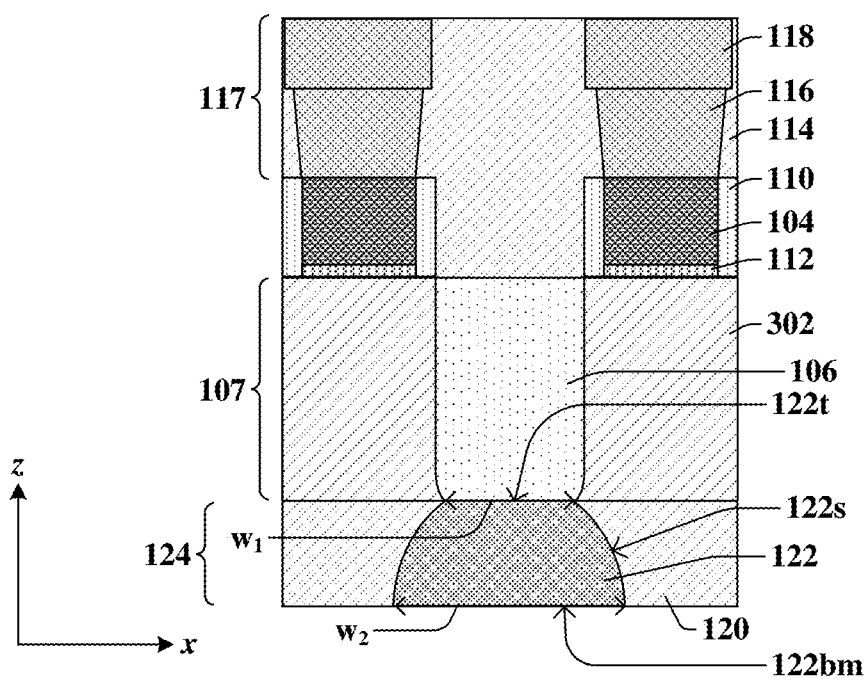

FIG. 3B illustrates a cross-sectional view 300B of some other embodiments of an integrated chip comprising a fin field effect transistor (finFET) that comprises a backside contact.

In some other embodiments, the backside contact 122 arranged below and coupled to the source/drain region 106 of the finFET comprises outermost sidewalls 122s that are substantially rounded. Thus, in some embodiments, the backside contact 122 has a rounded shape as described in FIG. 2A, for example.

Figure 4A:
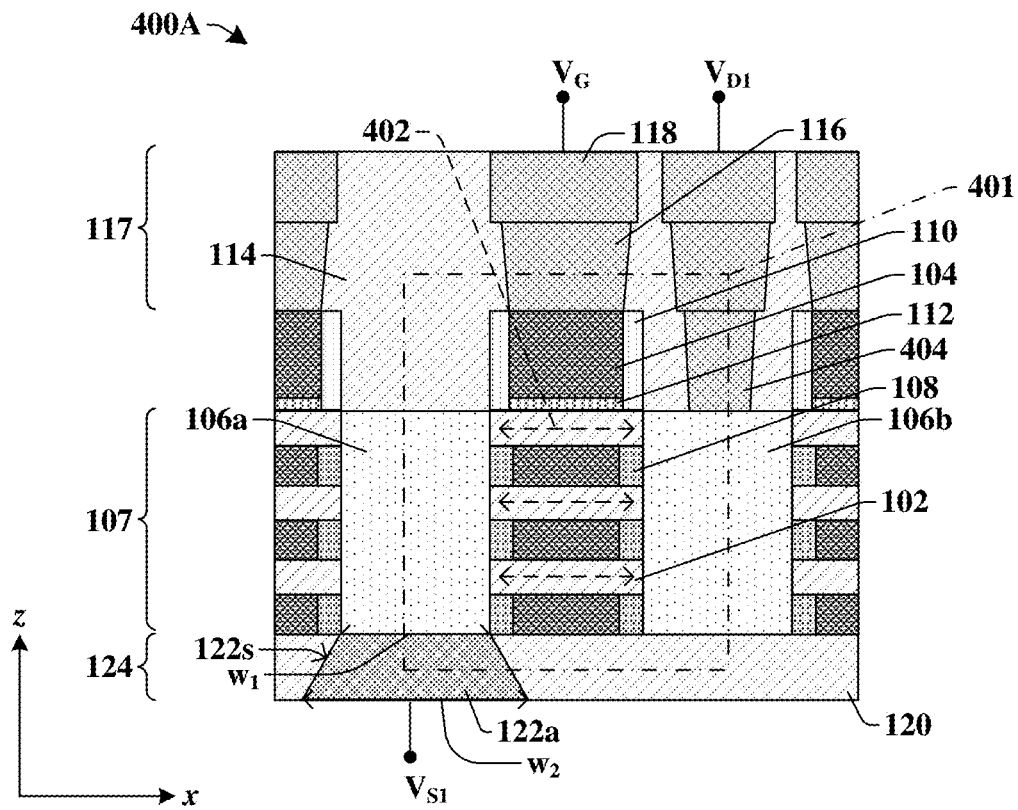
FIG. 4A illustrates a cross-sectional view of some embodiments of an integrated chip having a NSFET comprising a first backside contact arranged below and coupled to a first source/drain region, wherein the first backside contact has a bottommost surface that is wider than a topmost surface.

FIG. 4A illustrates a cross-sectional view 400A of some embodiments of an integrated chip comprising an NSFET with first and second source/drain regions between a channel structure, wherein a first backside contact is arranged on the first source/drain region.

In some embodiments, an NSFET 401 comprises a channel structure 107 extending between a first source/drain region 106a and a second source/drain region 106b. It will be appreciated that in some other embodiments, the NSFET 401 may be also known as, for example, a gate-all-around FET, a gate surrounding transistor, a multi-bridge channel (MBC) transistor, a nanowire FET, or the like. In some embodiments, the gate electrode 104 is arranged over the channel structure 107 and coupled to a gate voltage line $V_G$ through the upper interconnect structure 117. In some embodiments, a drain contact 404 is arranged over and coupled to second source/drain region 106b. Thus, in some embodiments, a drain voltage line $V_{D1}$ is coupled to the second source/drain region 106b through the upper interconnect structure 117. In some embodiments, the drain contact 404 and the interconnect contacts 116 of the upper interconnect structure have upper surfaces wider than bottom surfaces.

In some embodiments, the channel structure 107 comprises nanosheet channel structures 102, wherein the gate electrode 104 also is arranged between the nanosheet channel structures 102 in the z-direction. In some embodiments, the first source/drain region 106a is coupled to a first backside contact 122a arranged below the first source/drain region 106a. In such embodiments, to reduce defects (e.g., voids, seams, etc.) in the first backside contact 122a, the first backside contact 122a has a width that continuously decreases when measured in the z-direction from the lower interconnect dielectric structure 120 towards the upper interconnect dielectric structure 114.

In some embodiments, the first source/drain region 106a is a source region, and the second source/drain region 106b is a drain region. In some embodiments, the first source/drain region 106a is coupled to a source voltage line $V_{S1}$ through the first backside contact 122a. When a voltage bias that is greater than a threshold voltage of the NSFET 401 is applied across the nanosheet channel structures 102 by way of the gate voltage line $V_G$, the source voltage line $V_{S1}$, and the drain voltage line $V_{D1}$, the nanosheet channel structures 102 may be turned "ON" such that mobile charge carriers travel through a channel region 402 between the first and second source/drain regions 106a, 106b. At least due to the decreasing width of the first backside contact 122a in the z-direction from the lower interconnect dielectric structure 120 towards the upper interconnect dielectric structure 114, the NSFET 401 may be reliably turned "ON" and "OFF" when voltages are applied to the gate voltage line $V_G$, the source voltage line $V_{S1}$, and the drain voltage line $V_{D2}$.

Figure 4B:
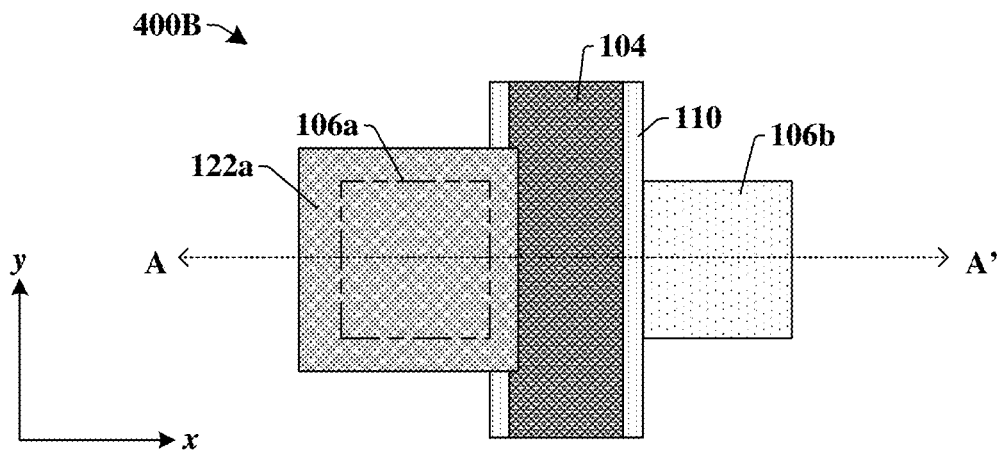
FIG. 4B illustrates a bottom-view of some embodiments corresponding to the cross-sectional view of FIG. 4A.

FIG. 4B illustrates a bottom-view 400B of some embodiments of the NSFET of FIG. 4A. In some embodiments, the bottom-view 400B of FIG. 4B is from a bottom-side perspective of FIG. 4A. Further, in some embodiments the bottom-view 400B of FIG. 4B ignores the lower interconnect dielectric structure 120 of FIG. 4A. The bottom-view 400B of FIG. 4B is from an xy-plane perspective. In some embodiments, the cross-sectional view 400A of FIG. 4A may correspond to cross-section line AA' of FIG. 4B.

As illustrated in the bottom-view 400B of FIG. 4B, in some embodiments, the first source/drain region 106a is arranged behind the first backside contact 122a, and thus, the first source/drain region 106a is illustrated with a hashed line. In some embodiments, the gate electrode 104 has a larger height in the y-direction than the first and second source/drain regions 106a, 106b. In some embodiments, the interconnect contact 116 coupled to the gate electrode 104 and the drain contact 404 coupled to the second source/drain region 106b are arranged behind the gate electrode 104 and the second source/drain region 106b, respectively, and thus, are not illustrated in the bottom-view 400B of FIG. 4B.

Figure 4C:
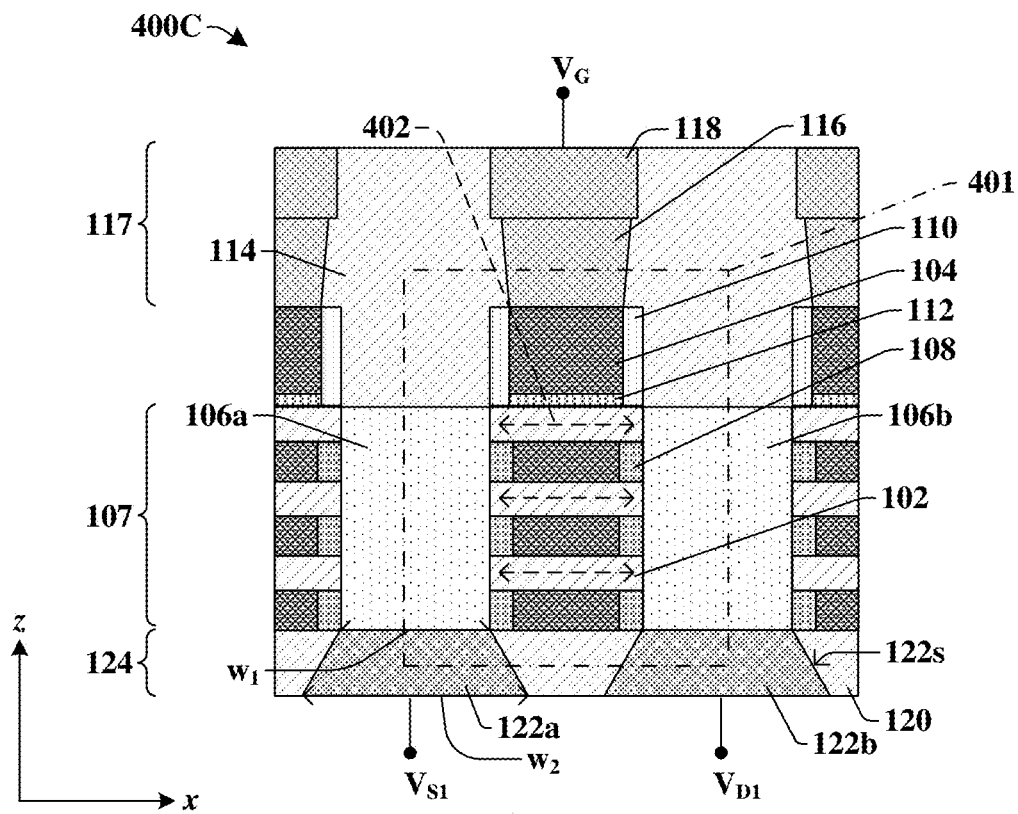
FIG. 4C illustrates a cross-sectional view of some embodiments of an integrated chip having a NSFET comprising a first backside contact and a second backside contact arranged below and coupled to a first source/drain region and a second source/drain region, respectively, wherein the first and second backside contacts have bottommost surfaces that are wider than topmost surfaces.

FIG. 4C illustrates a cross-sectional view 400C of some other embodiments of an NSFET, wherein backside contacts are arranged on the first and second source/drain regions.

As shown in the cross-sectional view 400C of FIG. 4C, in some other embodiments, a second backside contact 122b may be arranged below and coupled to the second source/drain region 106b of the NSFET 401 instead of the drain contact (404 of FIG. 4A). In such embodiments, the second backside contact 122b may also have a width that continuously decreases when measured in the z-direction from the lower interconnect dielectric structure 120 towards the upper interconnect dielectric structure 114. In such embodiments, the first and second backside contacts 122a, 122b may be spaced apart from one another in the x-direction by the lower interconnect dielectric structure 120. To reduce defects (e.g., voids, seams, etc.) in the first and second backside contacts 122a, 122b, the first and second backside contacts 122a, 122b have a width that continuously decreases when measured in the z-direction from the lower interconnect dielectric structure 120 towards the upper interconnect dielectric structure 114.

When a voltage bias that is greater than a threshold voltage of the NSFET 401 is applied across the nanosheet channel structures 102 by way of the gate voltage line $V_G$, the source voltage line $V_{S1}$, and the drain voltage line $V_{D1}$, the nanosheet channel structures 102 may be turned "ON" such that mobile charge carriers travel through a channel region 402 between the first and second source/drain regions 106a, 106b. At least due to the decreasing width of the first and second backside contacts 122a, 122b in the z-direction from the lower interconnect dielectric structure 120 towards the upper interconnect dielectric structure 114, the NSFET 401 may be reliably turned "ON" and "OFF" when voltages are applied to the gate voltage line $V_G$, the source voltage line $V_{S1}$, and the drain voltage line $V_{D1}$.

Figure 4D:
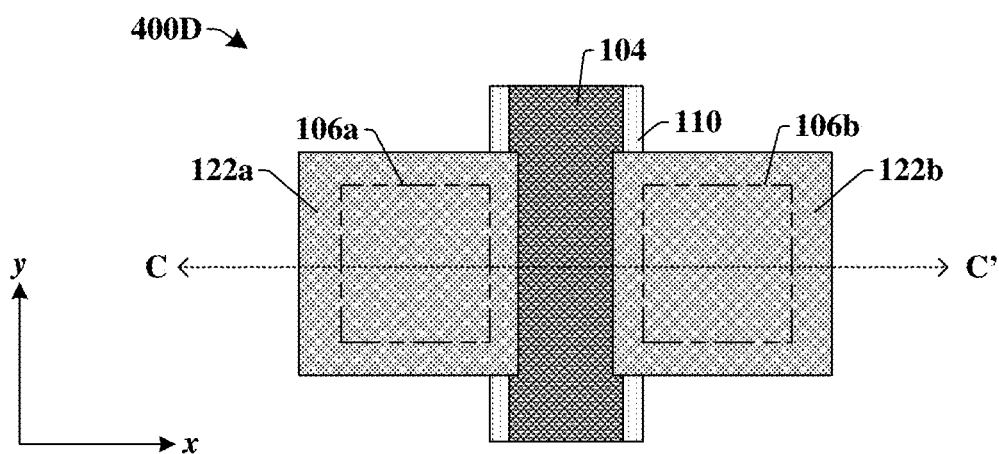
FIG. 4D illustrates a bottom-view of some embodiments corresponding to the cross-sectional view of FIG. 4C.

FIG. 4D illustrates a bottom-view 400D of some embodiments of the NSFET of FIG. 4C. In some embodiments, the bottom-view 400D of FIG. 4D is from a bottom-side perspective of FIG. 4C. Further, in some embodiments the bottom-view 400D of FIG. 4D ignores the lower interconnect dielectric structure 120 of FIG. 4C. The bottom-view 400D of FIG. 4D is from an xy-plane perspective. In some embodiments, the cross-sectional view 400C of FIG. 4C may correspond to cross-section line CC' of FIG. 4D.

As illustrated in the bottom-view 400D of FIG. 4D, in some embodiments, the first source/drain region 106a is arranged behind the first backside contact 122a, and the second source/drain region 106b is arranged behind the second backside contact 122b. Thus, the first and source/drain regions 106a, 106b are illustrated with hashed lines. In some embodiments, the interconnect contact 116 coupled to the gate electrode 104 is arranged behind the gate electrode 104, and thus, is not illustrated in the bottom-view 400D of FIG. 4D.

FIGS. 5A-24 illustrate cross-sectional views 500A-2400 of some embodiments of a method of forming a backside contact on a source/drain region of a transistor device. Although FIGS. 5A-24 are described in relation to a method, it will be appreciated that the structures disclosed in FIGS. 5A-24 are not limited to such a method, but instead may stand alone as structures independent of the method.

Figure 5A:
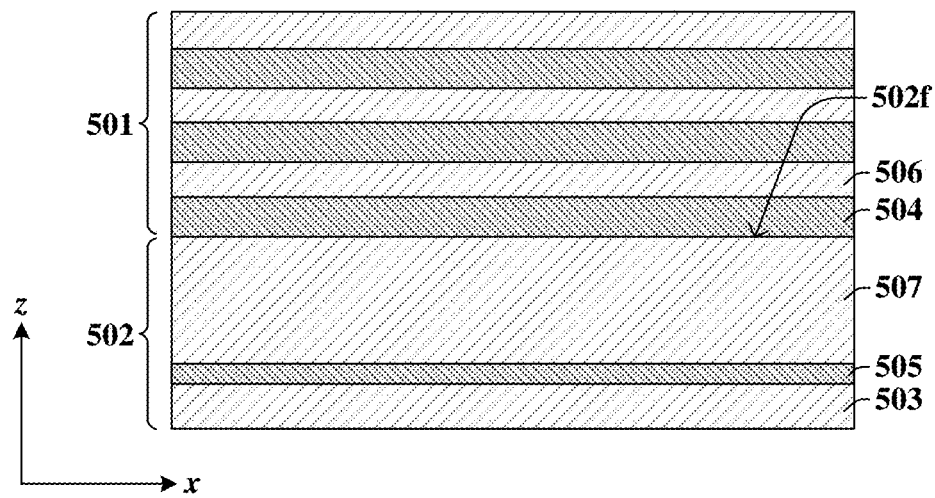
FIGS. 5A-24 illustrate cross-sectional views of some embodiments of a method of forming a transistor having a backside contact arranged below and coupled to a source/drain region, wherein the backside contact is formed within a backside trench that has a maximum width at a top of the backside trench.

As shown in cross-sectional view 500A of FIG. 5A, a substrate 502 is provided. In various embodiments, the substrate 502 may comprise any type of semiconductor body (e.g., silicon/CMOS bulk, Ge, SiGe, SOI, etc.) such as a semiconductor wafer or one or more die on a wafer, as well as any other type of semiconductor and/or epitaxial layers formed thereon and/or otherwise associated therewith.

In some embodiments, the substrate 502 comprises a lower semiconductor layer 503, an etch stop layer 505 arranged over the lower semiconductor layer 503, and an upper semiconductor layer 507 arranged over the etch stop layer 505. In some embodiments, the etch stop layer 505 comprises a semiconductor material, such as silicon germanium, that is different than the upper and lower semiconductor layers 503, 507. In some other embodiments, the etch stop layer 505 may comprise an oxide. In such other embodiments, the substrate 502 may be a silicon-on-insulator substrate, and the etch stop layer 505 may comprise, for example, silicon oxide. In some embodiments, the etch stop layer 505 may be partially doped. In other words, in some embodiments, the etch stop layer 505 may have a doping concentration in a range of between about 60 percent and about 85 percent, for example. In some embodiments, the etch stop layer 505 has a thickness in a range of between, for example, approximately 10 nanometers and approximately 20 nanometers.

In some embodiments, a stack of semiconductor layers 501 is formed over a frontside 502f of the substrate 502. The stack of semiconductor layers 501 may comprise spacer layers 504 and semiconductor layers 506 arranged in an alternating order. In some embodiments, the spacer layers 504 comprise a different material than the semiconductor layers 506. In some embodiments, for example, the spacer layers 504 comprise germanium silicon or germanium, whereas the semiconductor layers 506 comprise silicon. In some embodiments, the semiconductor layers 506 and the spacer layers 504 are formed by an epitaxy growth process from the substrate 502. In some embodiments, there may be more or less than three semiconductor layers 506 and three spacer layers 504.

Figure 5B:
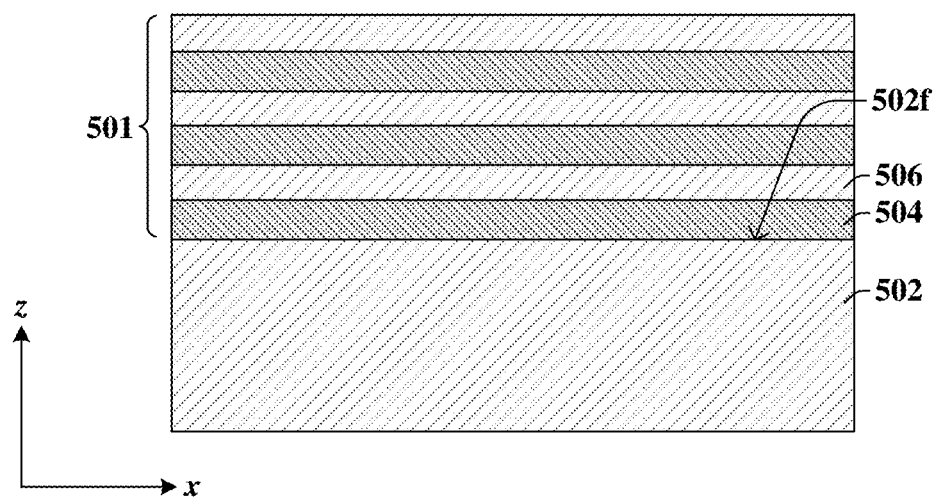

FIG. 5B illustrates a cross-sectional view 500B of some alternative embodiments of FIG. 5A, wherein the substrate 502 is a bulk substrate and does not comprise the etch stop layer (505 of FIG. 5A).

Figure 6:
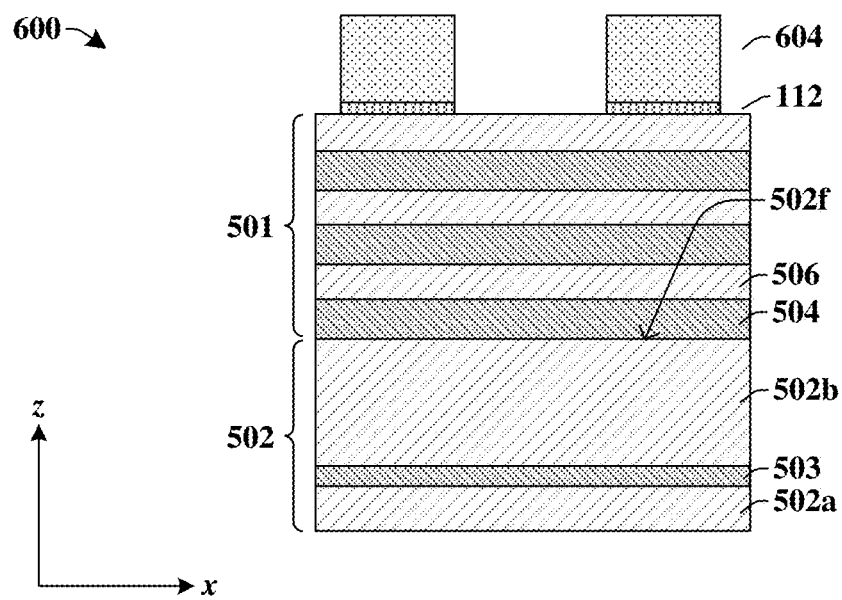

As shown in cross-sectional view 600 of FIG. 6, in some embodiments, a dummy gate structure 604 arranged over a gate dielectric layer 112 are formed over the stack of semiconductor layers 501. In some embodiments, to form the dummy gate structure 604 and the gate dielectric layer 112, a continuous gate dielectric layer is formed over the stack of semiconductor layers 501. In some embodiments, the continuous gate dielectric layer, and thus, the gate dielectric layer 112, comprises a dielectric material such as a nitride (e.g., silicon nitride, silicon oxynitride), a carbide (e.g., silicon carbide), an oxide (e.g., silicon oxide), or some other suitable material. In some embodiments, a continuous dummy gate layer is then formed over the continuous gate dielectric layer. In some embodiments, the dummy gate layer, and thus, the dummy gate structure 604, may comprise, for example, polysilicon. In some embodiments, the continuous gate dielectric layer and the continuous dummy gate layer are formed by way of a thermal oxidation process and/or deposition process (e.g., physical vapor deposition (PVD), chemical vapor deposition (CVD), plasma-enhanced CVD (PE-CVD), atomic layer deposition (ALD), etc.).

Then, in some embodiments, the gate dielectric layer 112 and the dummy gate structure 604 may be formed from the continuous gate dielectric layer and the continuous dummy gate layer, respectively, using photolithography and removal (e.g., etching) processes. In some embodiments, more than one dummy gate structure 604 and underlying gate dielectric layer 112 may be arranged over the stack of semiconductor layers 501. For example, in the cross-sectional view 600 of FIG. 6, two dummy gate structures 604 are spaced apart from one another over the stack of semiconductor layers 501.

Figure 7:
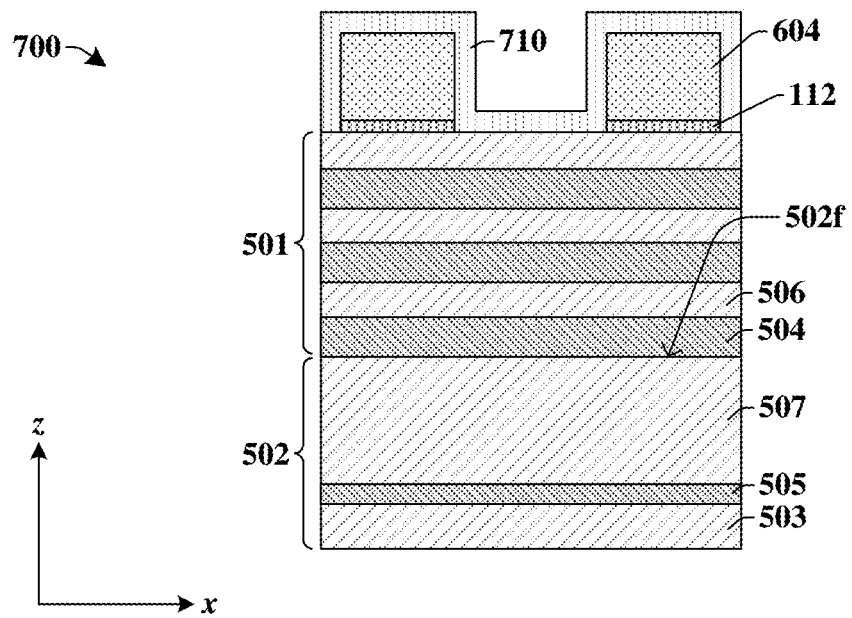

As shown in cross-sectional view 700 of FIG. 7, in some embodiments, a conformal first gate layer 710 is formed over the stack of semiconductor layers 501 and the dummy gate structure 604. In some embodiments, the conformal first gate layer 710 comprises an oxide (e.g., silicon dioxide), a nitride (e.g., silicon nitride, silicon oxynitride), a carbide (e.g., silicon carbide), or some other suitable dielectric material. In some embodiments, the conformal first gate layer 710 is formed by way of a deposition process (e.g., PVD, CVD, PE-CVD, ALD, etc.).

Figure 8A:
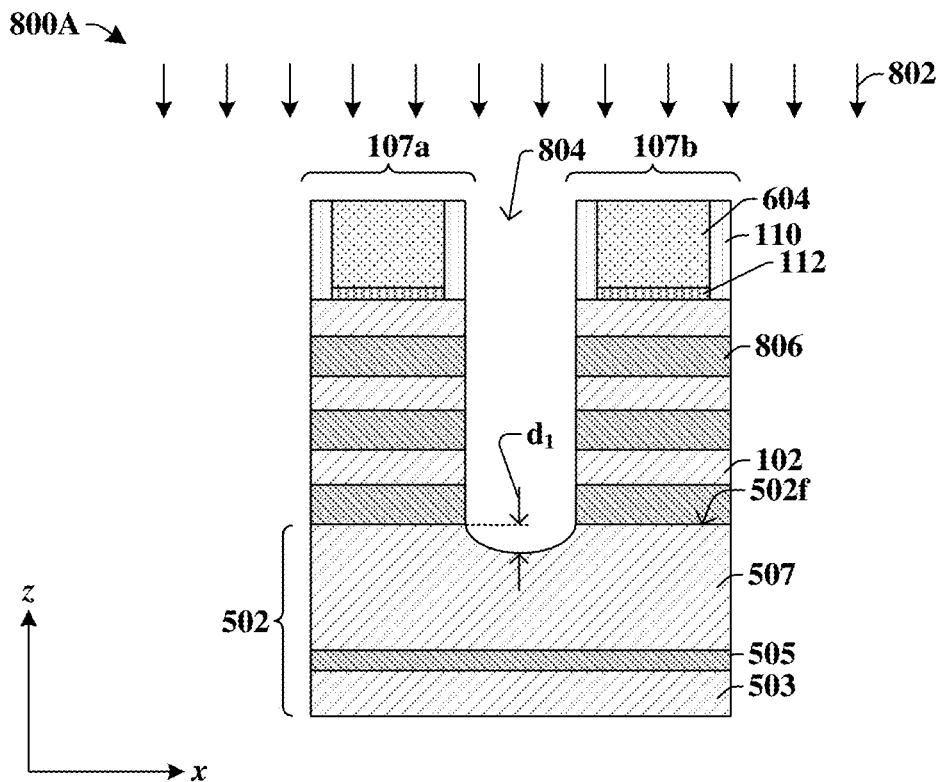

As shown in cross-sectional view 800A of FIG. 8A, in some embodiments, a first removal process 802 is performed to form a trench 804 between the dummy gate structures 604, thereby forming a first channel structure 107a spaced apart from a second channel structure 107b by the trench 804 and on a frontside 502f of the substrate 502. In some embodiments, the trench 804 has a depth measured in the z-direction in a range of between, for example, approximately 40 nanometers and approximately 100 nanometers. In some embodiments, the first removal process 802 removes portions of the semiconductor layers (506 of FIG. 7) and the spacer layers (504 of FIG. 7) that are uncovered by the dummy gate structures 604. In some embodiments, the dummy gate structures 604 act as a masking structure for the first removal process 802 such that each of the first and second channel structures 107a, 107b are arranged directly below the dummy gate structures 604. In some embodiments, the first and second channel structures 107a, 107b comprise multiple nanosheet channel structures 102 spaced apart from one another by patterned spacer layers 806 after the first removal process 802. Further, in some embodiments, the first removal process 802 removes substantially horizontal portions of the conformal first gate layer (710 of FIG. 7) to form upper gate spacer structures 110 on outermost sidewalls of the dummy gate structure 604 and the gate dielectric layer 112.

In some embodiments, the first removal process 802 removes a portion of the substrate 502. For example, in some embodiments, the trench 804 extends below the first and second channel structures 107a, 107b and into the substrate 502 by a first distance $d_1$. In some embodiments, the first distance $d_1$ is in a range of between, for example, approximately 5 nanometers and approximately 55 nanometers. In some embodiments, the first removal process 802 comprises a dry etchant and may be performed in the substantially vertical or the z-direction. In some such embodiments, the trench 804 may have a width measured in the x-direction that continuously decreases as the width of the trench 804 is measured from the dummy gate structure 604 to the substrate 502.

Figure 8B:
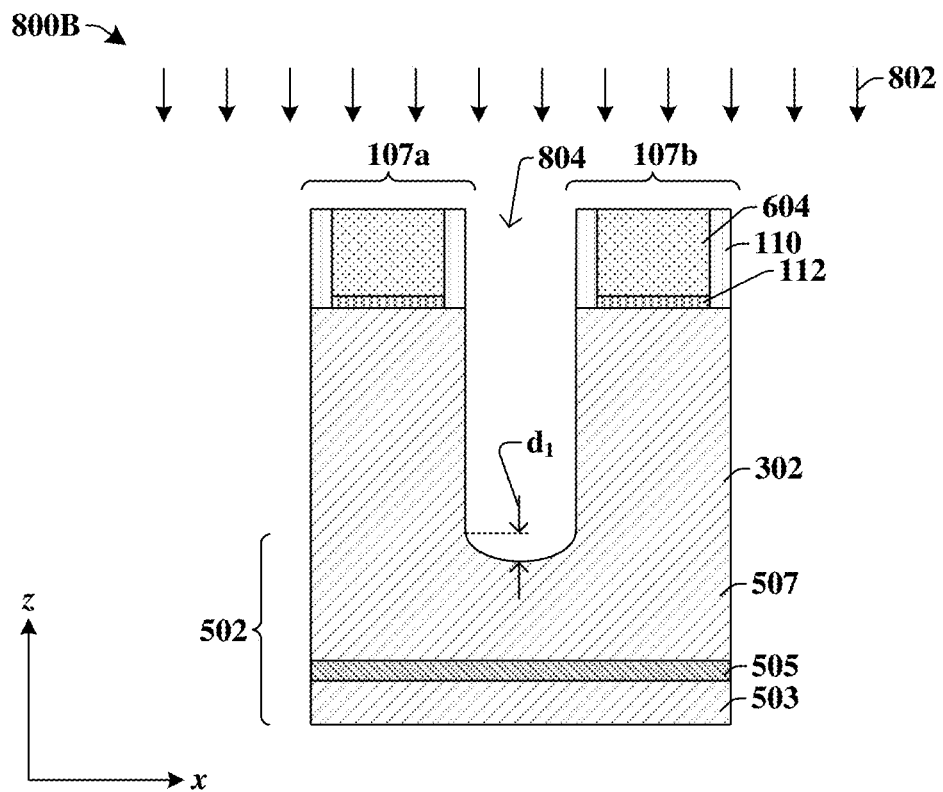

FIG. 8B illustrates a cross-sectional view 800B of some other embodiments of the method, wherein after the first removal process, the first and second channel structures 107a, 107b comprise fin structures 302. In other words, in some other embodiments, the method of FIGS. 5A-24 may be applied to transistors other than NSFETs. For example, in some embodiments, the method of FIGS. 5A-24 illustrating steps to form a backside contact on a source/drain region may be applied to a fin field effect transistor (finFET). In such other embodiments, the formation of the stack of semiconductor layers (501 of FIG. 5A) may be omitted from the method. In such embodiments, after the first removal process 802, the first channel structure 107a and the second channel structure 107b may each comprise a fin structure 302 that is continuously connected to and comprises a same material as the substrate 502.

Figure 9:
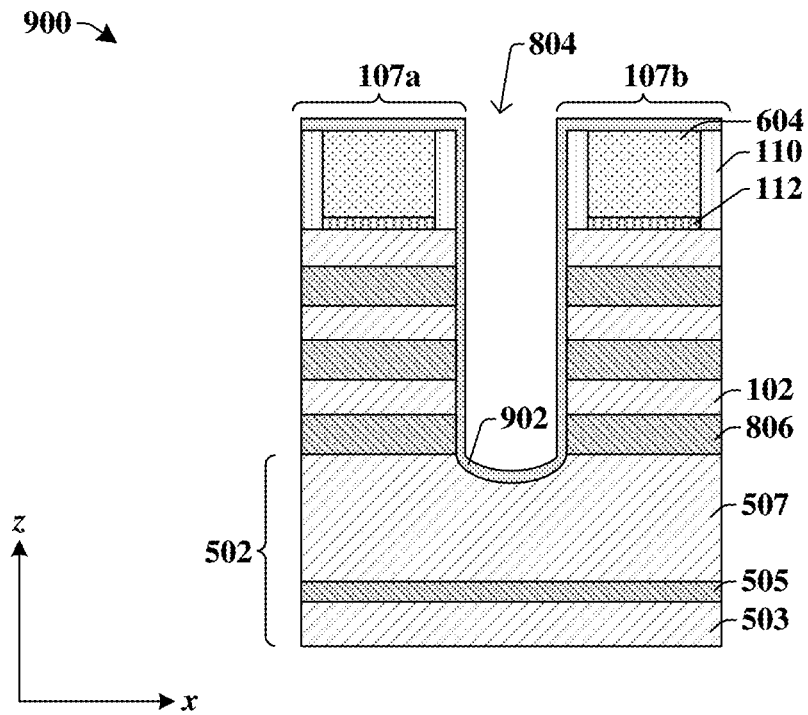

As shown in cross-sectional view 900 of FIG. 9, after the first removal process (802 of FIG. 8A), a continuous protection layer 902 is formed over the dummy gate structures 604, along outer sidewalls of the first and second channel structures 107a, 107b, and the substrate 502. In some embodiments, the continuous protection layer 902 comprises, for example, an oxide (e.g., silicon dioxide), a nitride (e.g., silicon nitride, silicon oxynitride), a carbide (e.g., silicon carbide), or some other suitable material. In some embodiments, the continuous protection layer 902 may be formed by way of a thermal oxidation process or deposition process (e.g., PVD, CVD, PE-CVD, ALD, etc.).

Figure 10:
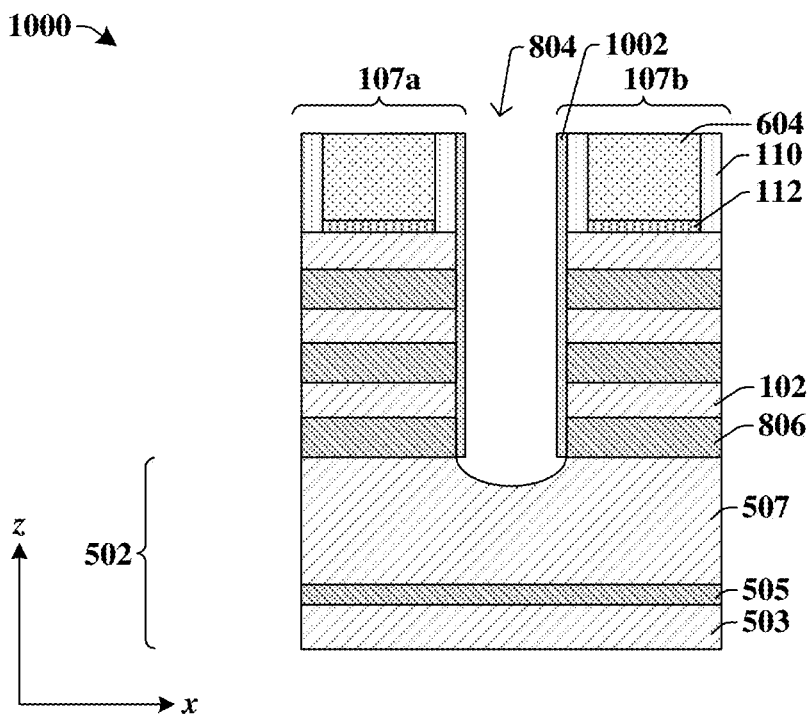

As shown in cross-sectional view 1000 of FIG. 10, in some embodiments, a removal process is performed to remove substantially horizontal portions of the continuous protection layer (902 of FIG. 9) from the substrate 502 and the dummy gate structures 604, thereby forming a protection layer 1002 on outer sidewalls of the first and second channel structures 107a, 107b. In some embodiments, the removal process of FIG. 10 used to form the protection layer 1002 comprises a dry etching process that utilizes a dry etchant performed in the substantially vertical or z-direction.

Figure 11A:
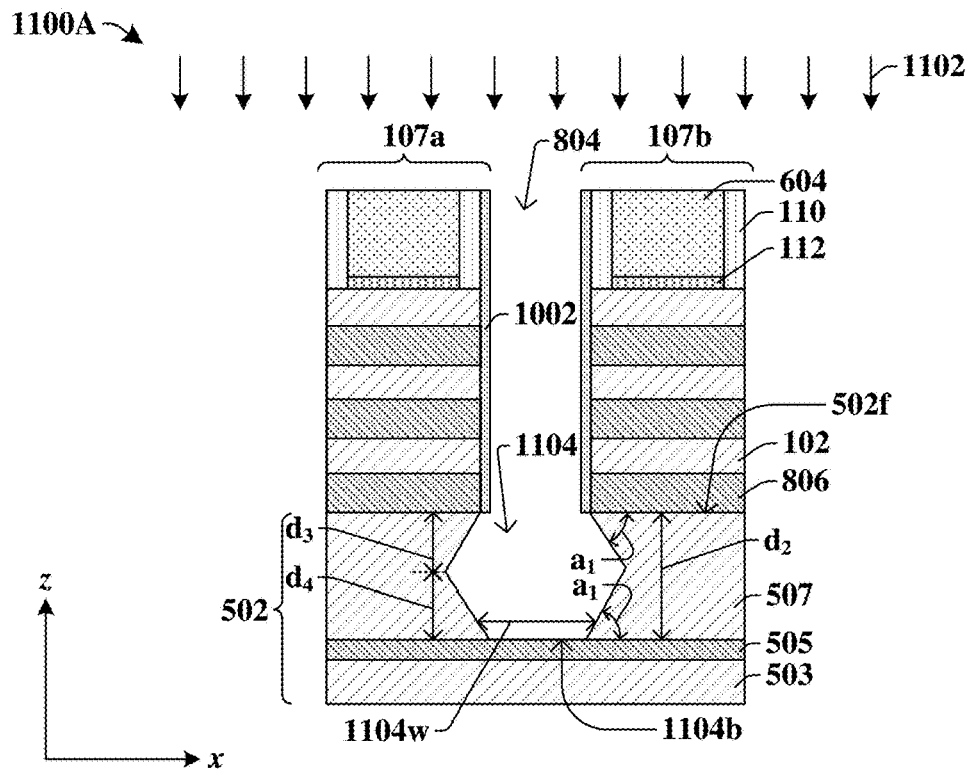

As shown in cross-sectional view 1100A of FIG. 11A, in some embodiments, a second removal process 1102 is performed to form a cavity 1104 within the substrate 502 that is coupled to the trench 804. In some embodiments, the cavity 1104 is arranged below the first and second channel structures 107a, 107b. In some embodiments, the second removal process 1102 is a wet etching process that utilizes a wet etchant. Thus, in some embodiments, the cavity 1104 is wider than the trench 804 and is arranged directly below the first and second channel structures 107a, 107b because the wet etchant of the second removal process 1102 removes portions of the substrate 502 in the x-direction and in the y-direction. In some embodiments, the protection layer 1002 protects the first and second channel structures 107a, 107b from removal by the second removal process 1102. In other words, in some embodiments, the protection layer 1002, the dummy gate structure 604 and the upper gate spacer structures 110 are substantially resistant to removal by the second removal process 1102.

In some embodiments, the wet etchant used during the second removal process 1102 comprises ammonium hydroxide. In such embodiments, the cavity 1104 may exhibit a hexagonal-like profile from the xz-plane as in FIG. 11A because the ammonium hydroxide removes the substrate 502 along certain planes of the substrate 502 at different etch rates. In such embodiments, the ammonium hydroxide is an anisotropic etch because it has different etch rates in different directions. In some embodiments, the ammonium hydroxide removes the [111] planes of the substrate 502 faster (e.g., up to 10-20 times) than the [100] planes of the substrate 502. Further, in some embodiments, the ammonium hydroxide removes the [100] planes of the substrate 502 faster (e.g., 1-2 times) than the [110] planes of the substrate 502. In some embodiments, a bottom surface 1104b of the cavity 1104 is defined by the etch stop layer 505 of the substrate 502. Thus, in some embodiments, the etch stop layer 505 of the substrate 502 is substantially resistant to removal by the second removal process 1102 and prevents the second removal process 1102 from extending through the entire substrate 502. In some such embodiments, the cavity 1104 is formed within the upper semiconductor layer 507 and not the lower semiconductor layer 503 of the substrate 502.

It will be appreciated that the exact shape of the cavity 1104 is dependent upon the material of the substrate 502, the crystal structure of the substrate 502, and/or the second removal process 1102 parameters (e.g., etchant time, etchant composition, etc.). In some embodiments, wherein the second removal process 1102 comprises an anisotropic wet etchant, such as ammonium hydroxide, the cavity 1104 formed in the substrate 502 will resemble some type of polygon-shape.

In some embodiments, the ammonium hydroxide is between approximately 20 weight percent to approximately 35 weight percent in a water solvent. In some embodiments, the concentration between the ammonium hydroxide to the water solvent ranges from a ratio between approximately 1:3 to approximately 1:20. In some embodiments, the second removal process 1102 may be conducted in a single wafer processing chamber set to a temperature in a range of between about 25 degrees Celsius and about 60 degrees Celsius. In some embodiments, the second removal process 1102 may be performed for approximately 10 seconds to approximately 120 seconds when ammonium hydroxide is used.

In some embodiments, the bottom surface 1104b of the cavity 1104 is arranged at a first angle $a_1$ with a lower outermost sidewall of the cavity 1104. Similarly, in some embodiments, an upper outermost sidewall of the cavity 1104 is arranged at the first angle $a_1$ with the frontside 502f of the substrate 502. In some embodiments, the first angle $a_1$ is an acute angle (e.g., less than 90 degrees). In some embodiments, the first angle $a_1$ may be in a range of between, for example, approximately 40 degrees and approximately 60 degrees. In some embodiments, the bottom surface 1104b of the cavity is arranged at a second distance $d_2$ below the frontside 502f of the substrate 502. In some embodiments, the second distance $d_2$ is in a range of between, for example, approximately 40 nanometers and approximately 90 nanometers. Further, in some embodiments, the cavity 1104 may have a variable width 1104w that is measured in the x-direction. In some embodiments, the variable width 1104w of the cavity 1104 varies through the z-direction of the cavity 1104. In some embodiments, the variable width 1104w of the cavity 1104 may be in a range of between, for example, approximately 20 nanometers and approximately 80 nanometers. In some embodiments, the variable width 1104w has a maximum value arranged at a third distance $d_3$ below a lowermost one of the patterned spacer layers 806. Similarly, in some embodiments, the variable width 1104w has a maximum value arranged at a fourth distance $d_4$ above the etch stop layer 505.

Figure 11B:
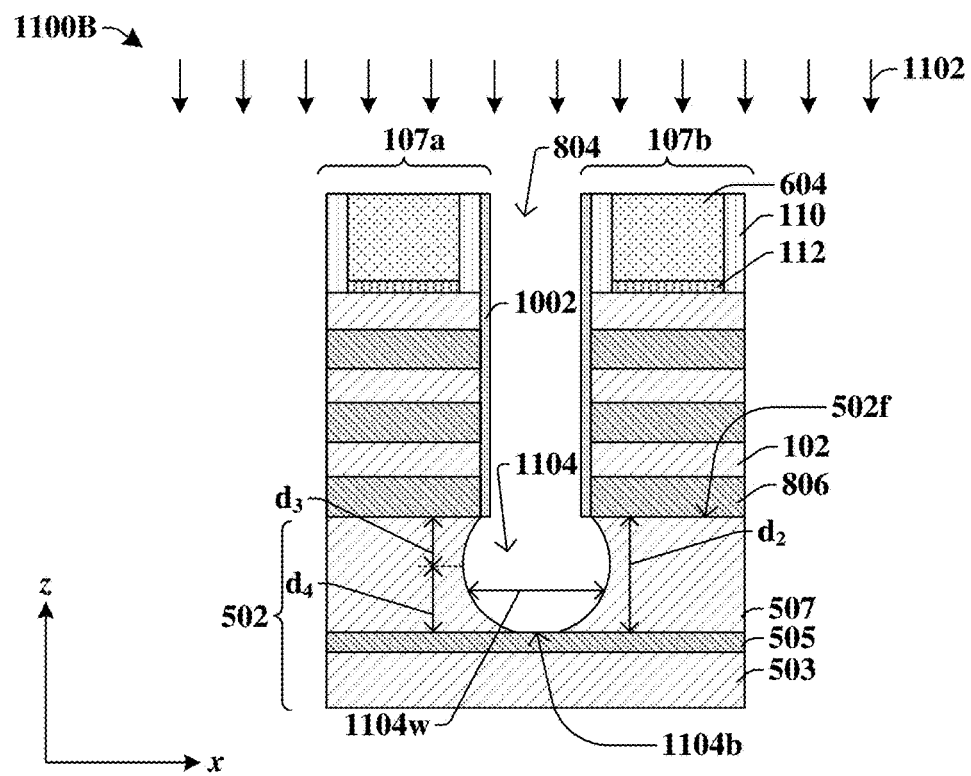

FIG. 11B illustrates a cross-sectional view 1100B of some other embodiments, wherein the cavity 1104 formed by the second removal process 1102 resembles a circle on the xz-plane.

In some such embodiments, the second removal process 1102 may comprise an isotropic wet etchant. For example, in some embodiments, the isotropic wet etchant comprises diluted hydrofluoric acid in an ozone water mixture, which is commonly known as a "FOM isotropic etchant." In such embodiments, the ozone water mixture of the FOM isotropic etchant oxidizes portions of the substrate 502 (e.g., oxidizes a silicon substrate to silicon dioxide) while the diluted hydrofluoric acid of the FOM isotropic etchant removes the oxidized portions of the substrate 502 (e.g., silicon dioxide) to form the cavity 1104. In such embodiments, the isotropic wet etchant may remove portions of the substrate 502 in all directions at a substantially constant rate of removal such that the cavity 1104 has an overall circular shape.

In some embodiments, the hydrofluoric acid is between approximately 40 weight percent to approximately 60 weight percent in ozone-water. In some embodiments, the concentration between the hydrofluoric acid to the ozone-water ranges from a ratio between approximately 1:1 to approximately 1:10. In some embodiments, the second removal process 1102 may be conducted in a single wafer processing chamber set to a temperature in a range of between about 20 degrees Celsius and about 40 degrees Celsius. In some embodiments, the second removal process 1102 may be performed for approximately 30 minutes to approximately 120 minutes when the FOM isotropic etchant is used.

In some embodiments, a bottom surface 1104b of the cavity, as defined by the etch stop layer 505, is arranged at a second distance $d_2$ below the frontside 502f of the substrate 502. In some embodiments, the second distance $d_2$ is in a range of between, for example, approximately 40 nanometers and approximately 90 nanometers. Further, in some embodiments, the cavity 1104 may have a variable width 1104w that is measured in the x-direction. In some embodiments, the variable width 1104w of the cavity 1104 varies through the z-direction of the cavity 1104. In some embodiments, the variable width 1104w of the cavity 1104 may be in a range of between, for example, approximately 20 nanometers and approximately 100 nanometers. In some embodiments, the variable width 1104w has a maximum value arranged at a third distance $d_3$ below a lowermost one of the patterned spacer layers 806. Similarly, in some embodiments, the variable width 1104w has a maximum value arranged at a fourth distance $d_4$ above the etch stop layer 505.

Figure 11C:
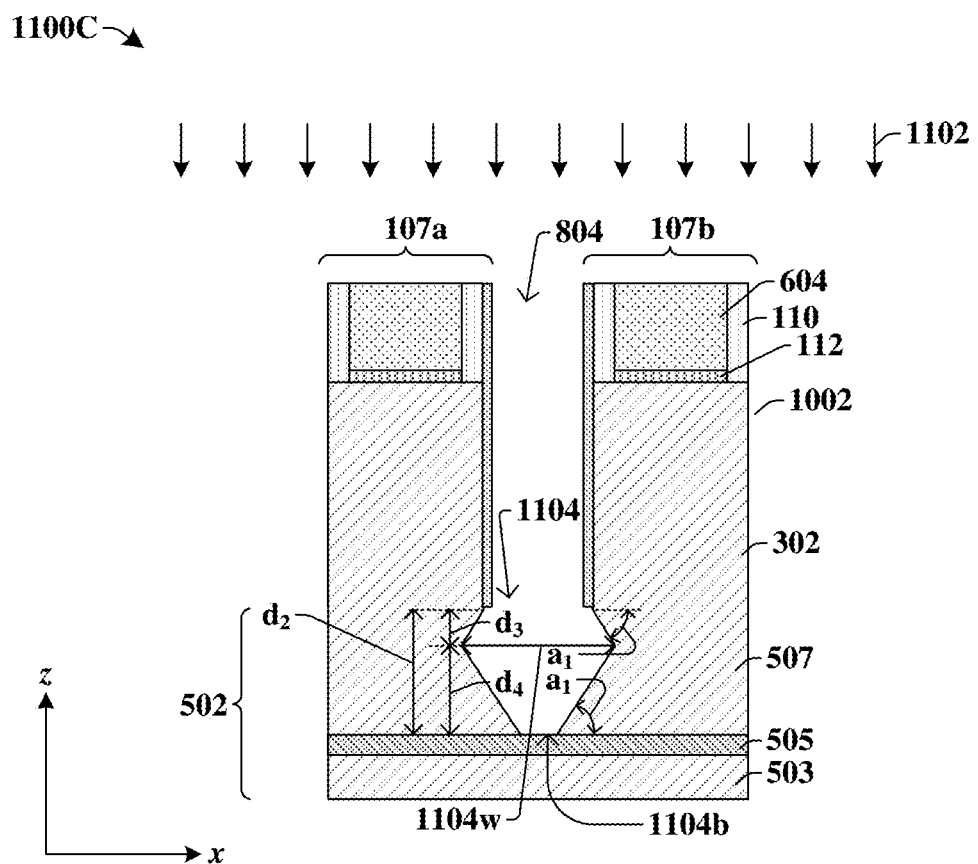
Figure 12:
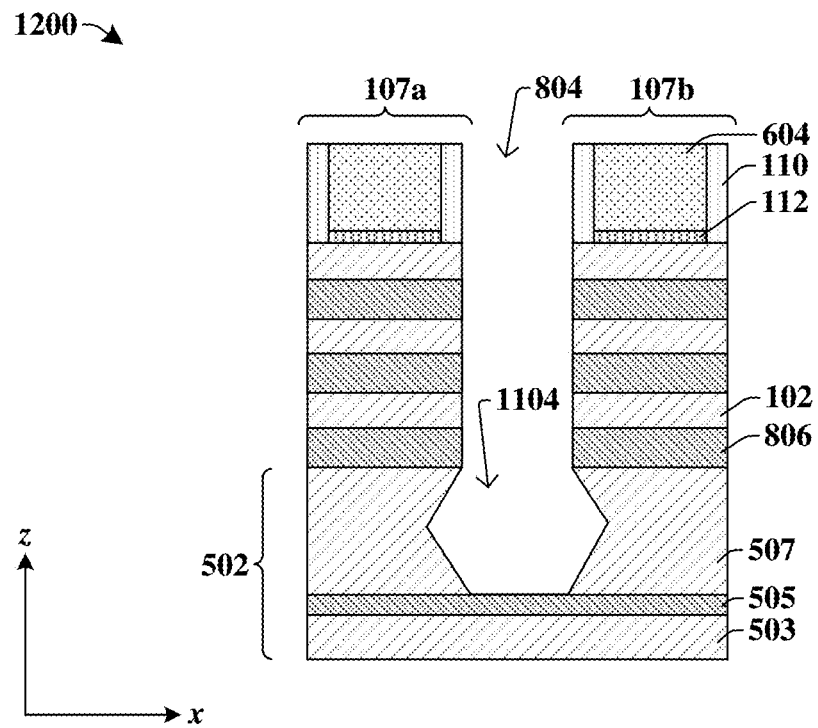

FIG. 11C illustrates a cross-sectional view 1100C of some other embodiments of the method after the second removal process 1102, wherein first and second channel structures 107a, 107b comprise fin structures 302.

In some such embodiments, the wet etchant used during the second removal process 1102 comprises ammonium hydroxide. In such embodiments, the cavity 1104 may exhibit a hexagonal-like profile from the xz-plane as explained in FIG. 11A because the ammonium hydroxide removes the substrate 502 along certain planes of the substrate 502 at different etch rates. In some other embodiments (not shown), the wet etchant of the second removal process 1102 may comprise the FOM isotropic etchant as described in FIG. 11B, and thus, the cavity 1104 of FIG. 11C would have a more rounded profile.

In some embodiments, the cavity 1104 of FIG. 11C has a depth equal to a second distance $d_2$ measured in the z-direction. In some embodiments, the second depth $d_2$ is in a range of between, for example approximately 40 nanometers and approximately 80 nanometers. In some embodiments, an upper portion of the cavity 1104 may have a depth equal to a third distance $d_3$, and a lower portion of the cavity 1104 may have a depth equal to a fourth distance $d_4$, wherein the second distance $d_2$ equals to the sum of the third and fourth distances $d_3$, $d_4$. In some embodiments, the third distance $d_3$ may be in a range of between, for example, approximately 10 nanometers and approximately 30 nanometers, and the fourth distance $d_4$ may be in a range of between for example, approximately 30 nanometers and approximately 50 nanometers, for example, As shown in cross-sectional view 1200 of FIG. 12, in some embodiments, the method proceeds from FIG. 11A to FIG. 12. In some embodiments, in FIG. 12, the protection layer (1002 of FIG. 11A) is removed from the first and second channel structures 107a, 107b. In some embodiments, the removal of the protection layer (1002 of FIG. 11A) may be performed through a wet or dry etching process.

Figure 13:
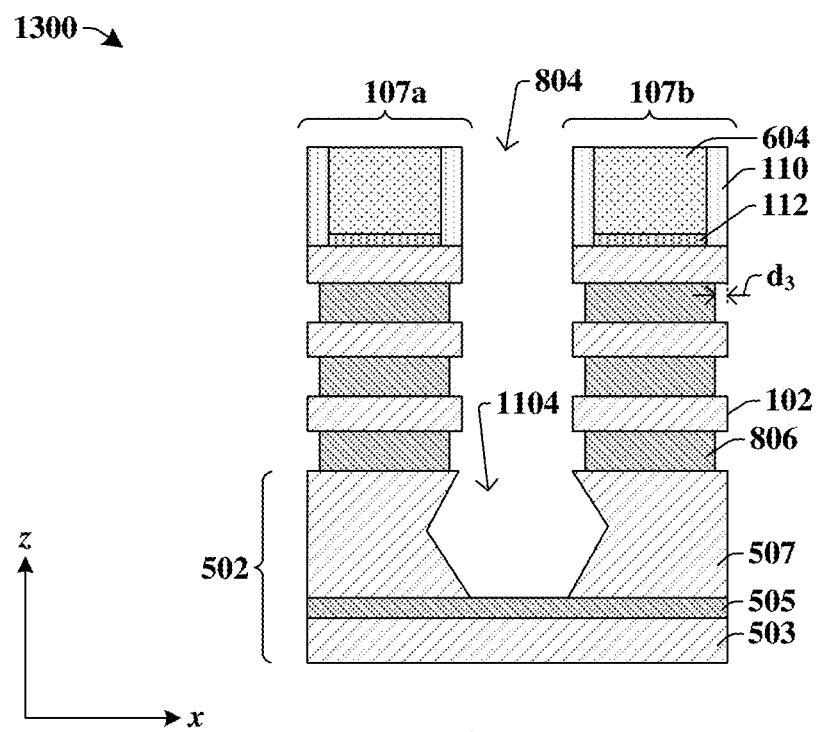

As shown in cross-sectional view 1300 of FIG. 13, in some embodiments, a lateral removal process may be performed to selectively remove outer portions of the patterned spacer layers 806. In some embodiments, the lateral removal process reduces a width of the patterned spacer layers 806 by two times a fifth distance $d_5$. In some embodiments, the lateral removal process is a wet or dry etching process. In some embodiments, the lateral removal process comprises an isotropic etchant. In some embodiments, the nanosheet channel structures 102 and the substrate 502 comprise different materials than the patterned spacer layers 806 and are resistant to removal by the lateral removal process of FIG. 13.

Figure 14:
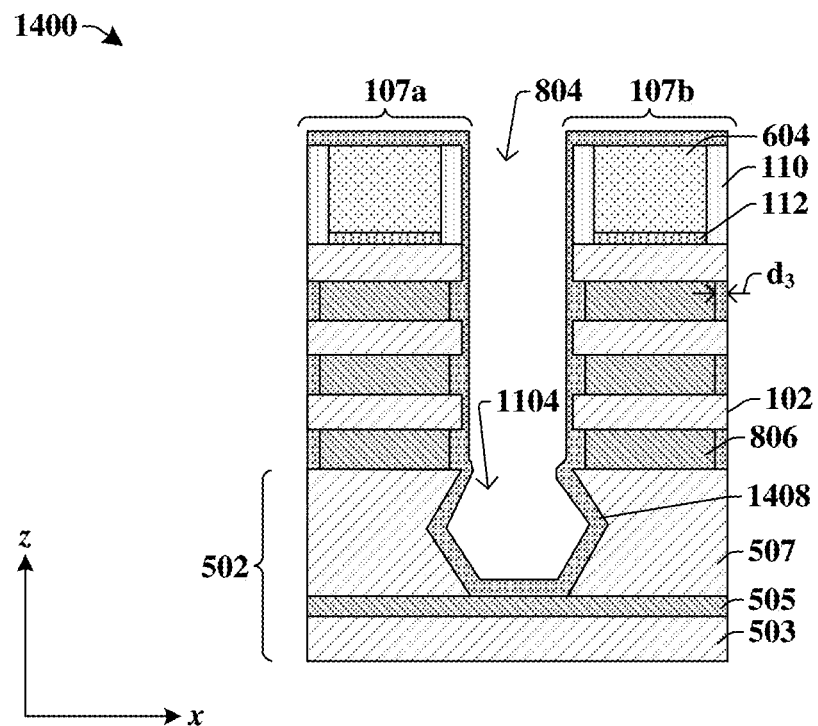

As shown in cross-sectional view 1400 of FIG. 14, in some embodiments, a spacer layer 1408 is formed over the first and second channel structures 107a, 107b and the etch stop layer 505 of the substrate 502. In some embodiments, the spacer layer 1408 comprises, for example, a dielectric material such as silicon nitride, silicon oxynitride, silicon carbon nitride, or some other suitable dielectric material. In some embodiments, the spacer layer 1408 is formed by way of a deposition process (e.g., PVD, CVD, PE-CVD, ALD, etc.). In some embodiments, the spacer layer 1408 has a thickness that is at least equal to the third distance $d_3$.

Figure 15:
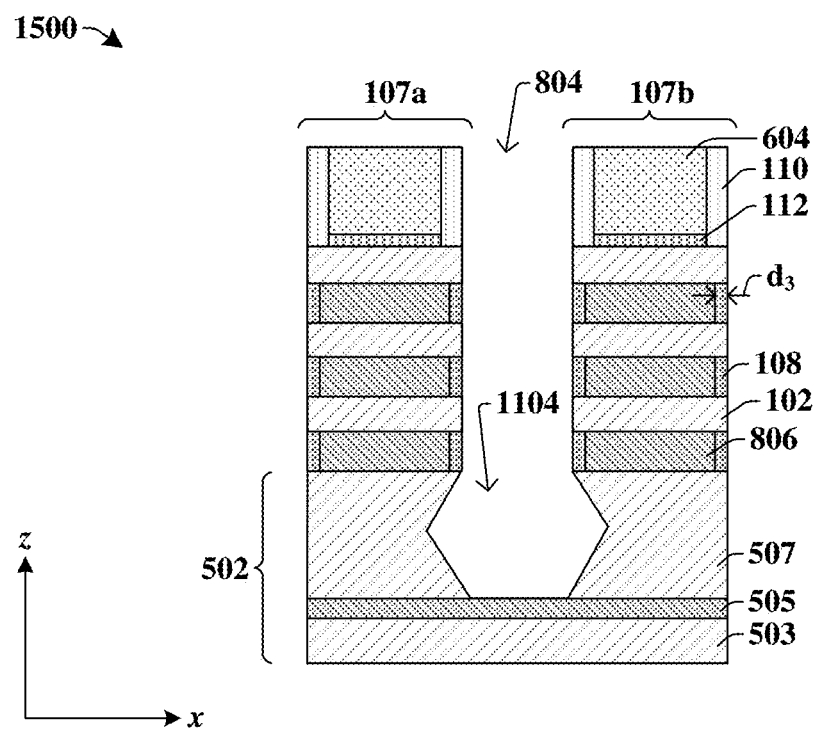

As shown in cross-sectional view 1500 of FIG. 15, a removal process is performed to remove portions of the spacer layer (1408) that are not arranged directly on the patterned spacer layers 806 to form inner gate spacer structures 108 directly between the nanosheet channel structures 102. In some embodiments, the removal process of FIG. 15 comprises a wet or dry etchant.

It will be appreciated that in some other embodiments, wherein the first and second channel structures do not comprise nanosheet channel structures 102 such as in a finFET device, the steps in FIG. 13-15 may be omitted.

Figure 16:
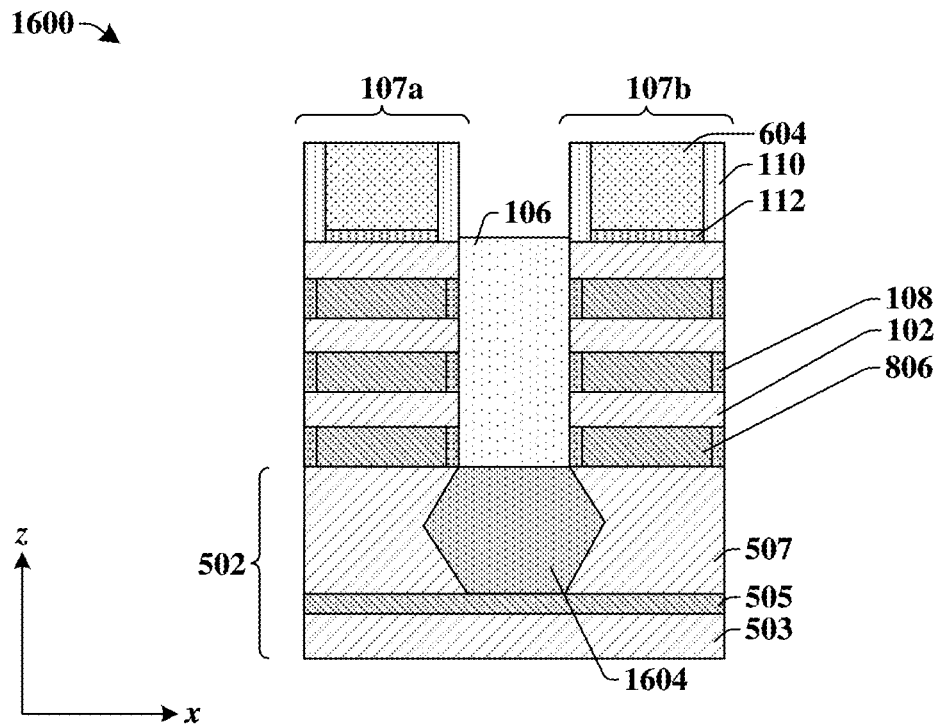

As shown in cross-sectional view 1600 of FIG. 16, in some embodiments, a dummy source/drain material 1604 is formed within the cavity (1104 of FIG. 15) of the substrate 502, and a source/drain region 106 is formed over the dummy source/drain material 1604 and directly between the first and second channel structures 107a, 107b. In some embodiments, the dummy source/drain material 1604 may comprise a semiconductor material that is formed by an epitaxy growth process from the etch stop layer 505 of substrate 502. For example, in some embodiments, the dummy source/drain material 1604 comprise silicon germanium or some other suitable semiconductor material. The dummy source/drain material 1604 comprises a same or different material than the etch stop layer 505 of the substrate 502. In some embodiments, the source/drain region 106 also comprises a semiconductor material that is formed by an epitaxy growth process. In some embodiments, the source/drain region 106 comprises doped (e.g., n-type, p-type) silicon germanium or some other suitable semiconductor material. In some embodiments, the dummy source/drain material 1604 comprises an undoped semiconductor material, whereas the source/drain region 106 comprises a doped material. Further, in some embodiments, the dummy source/drain material 1604 is wider than the source/drain region 106.

Figure 17:
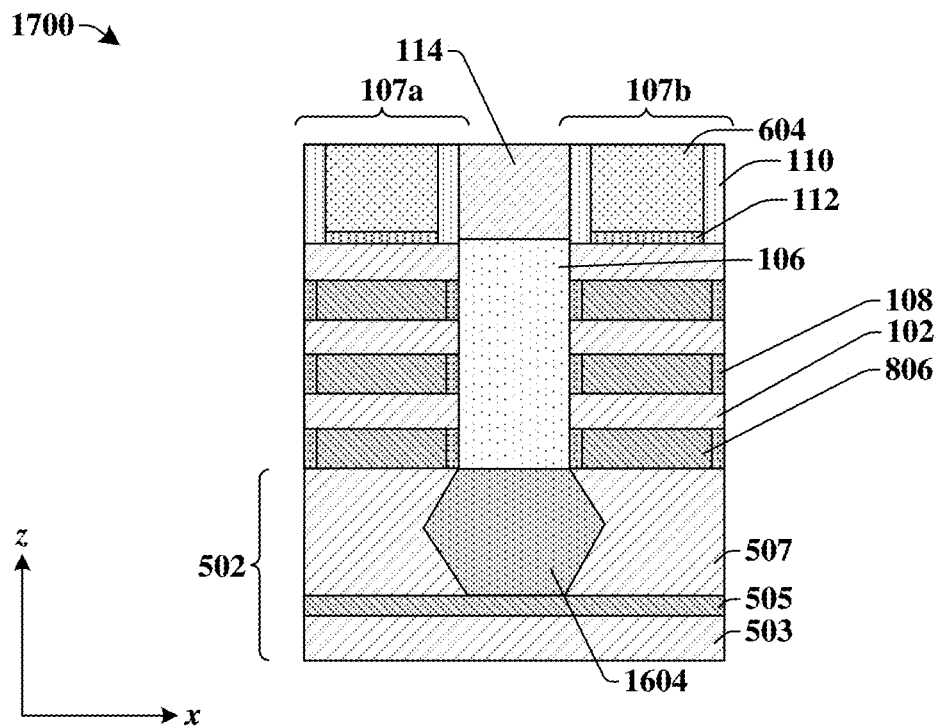

As shown in cross-sectional view 1700 of FIG. 17, in some embodiments, an upper interconnect dielectric structure 114 is formed over the source/drain region 106 and between the dummy gate structures 604. In some embodiments, the upper interconnect dielectric structure 114 comprises, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the upper interconnect dielectric structure 114 may be formed by way of a deposition process (e.g., PVD, CVD, PE-CVD, ALD, etc.).

Figure 18:
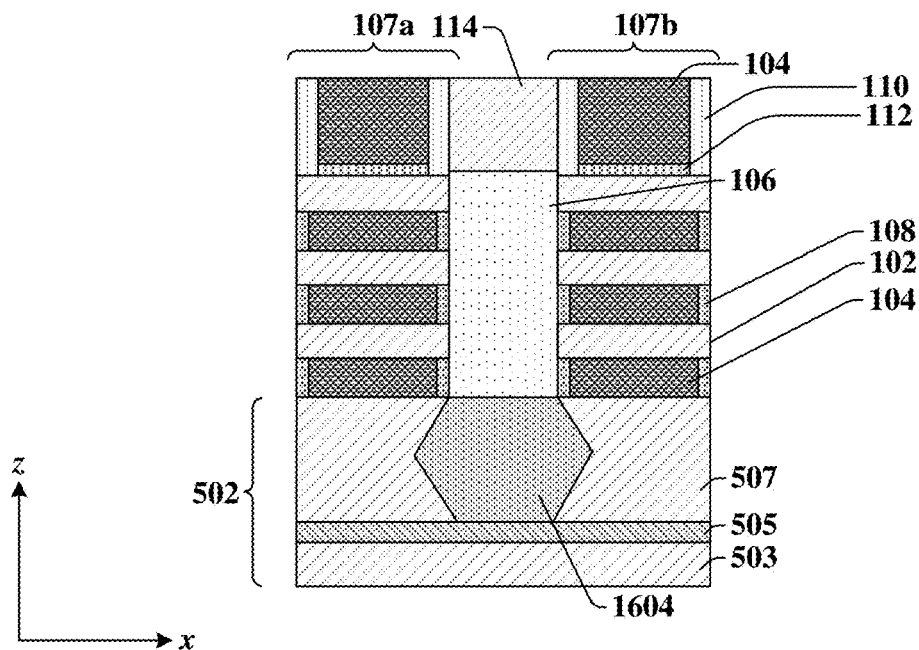

As shown in cross-sectional view 1800 of FIG. 18, in some embodiments, the dummy gate structures (604 of FIG. 17) are removed and replaced by gate electrodes 104. In some embodiments, the dummy gate structures (604 of FIG. 17) are removed by an etching (e.g., wet, dry) process. In some embodiments, the inner gate spacer structures 108, the upper gate spacer structures 110, and the gate dielectric layer 112 are substantial resistant to removal by the removal process of FIG. 18. In some embodiments, the gate electrodes 104 are formed over and between the nanosheet channel structures 102. In some embodiments, the gate electrodes 104 are formed by way of a deposition process (e.g., PVD, CVD, PE-CVD, ALD, sputtering, etc.). In some embodiments, the gate electrodes 104 comprise a conductive material, such as, for example, titanium, tantalum, aluminum, or some other suitable conductive material.

Further, in some embodiments, after removing the dummy gate structures (604 of FIG. 17) but before forming the gate electrodes 104, additional gate dielectric layers may be formed on the nanosheet channel structures 102. Further in some embodiments, the gate electrodes 104 may comprise multiple layers of conductive materials.

Figure 19:
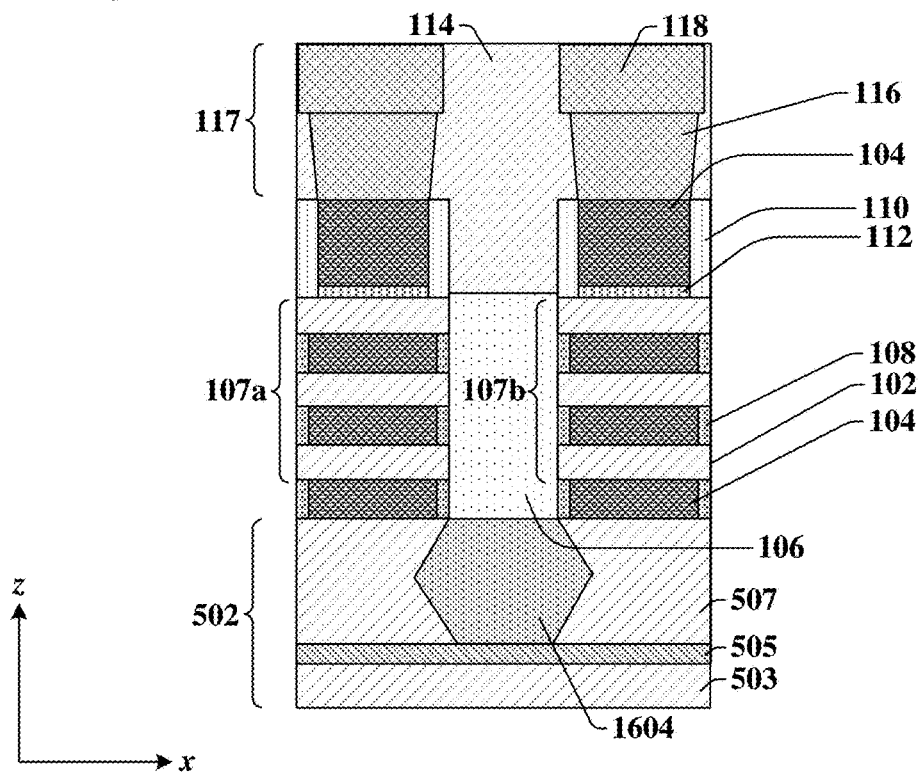

As illustrated in cross-sectional view 1900 of FIG. 19, in some embodiments, an upper interconnect structure 117 is formed over the gate electrodes 104. In some embodiments, the upper interconnect structure 117 comprises an interconnect contact 116 and an interconnect conductive structure 118 arranged within the upper interconnect dielectric structure 114. In some embodiments, the interconnect contact 116 and the interconnect conductive structure 118 may comprise a conductive material such as, for example, copper, aluminum, tungsten, tantalum, titanium, or some other suitable conductive material. In some embodiments, the upper interconnect structure 117 is formed through various steps comprising deposition processes (e.g., physical vapor deposition (PVD), chemical vapor deposition (CVD), PE-CVD, atomic layer deposition (ALD), sputtering, etc.), removal processes (e.g., wet etching, dry etching, chemical mechanical planarization (CMP), etc.), and/or patterning processes (e.g., photolithography/etching). Further, in some embodiments, the upper interconnect structure 117 does not comprise any contacts/vias coupled to the source/drain region 106.

Figure 20:
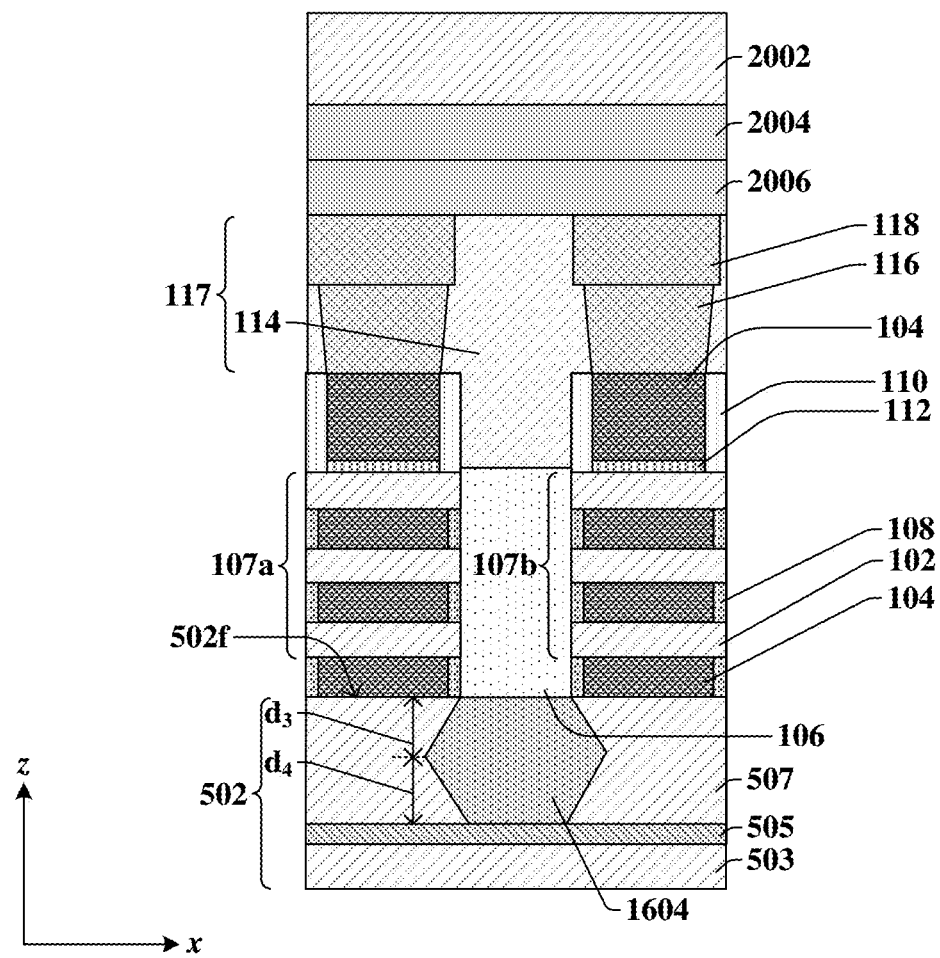

As shown in cross-sectional view 2000 of FIG. 20, in some embodiments, a first bonding layer 2006 is formed over the upper interconnect structure 117, and then a second bonding layer 2004 arranged on a carrier substrate 2002 is bonded to the first bonding layer 2006. In other words, in some embodiments, the carrier substrate 2002 is bonded to the upper interconnect structure 117 on the frontside 502f of the substrate 502 through the first and second bonding layers 2006, 2004.

In some embodiments, the first and second bonding layers 2006, 2004 are formed by way of a deposition process (e.g., PVD, CVD, PE-CVD, ALD, etc.). In some embodiments, the first and second bonding layers 2006, 2004 comprise an oxide, such as, for example, silicon dioxide. In some embodiments, the bonding process to bond the first bonding layer 2006 to the second bonding layer 2004 may comprise a thermal bonding process, for example. It will be appreciated that other bonding processes are also within the scope of the disclosure.

Figure 21:
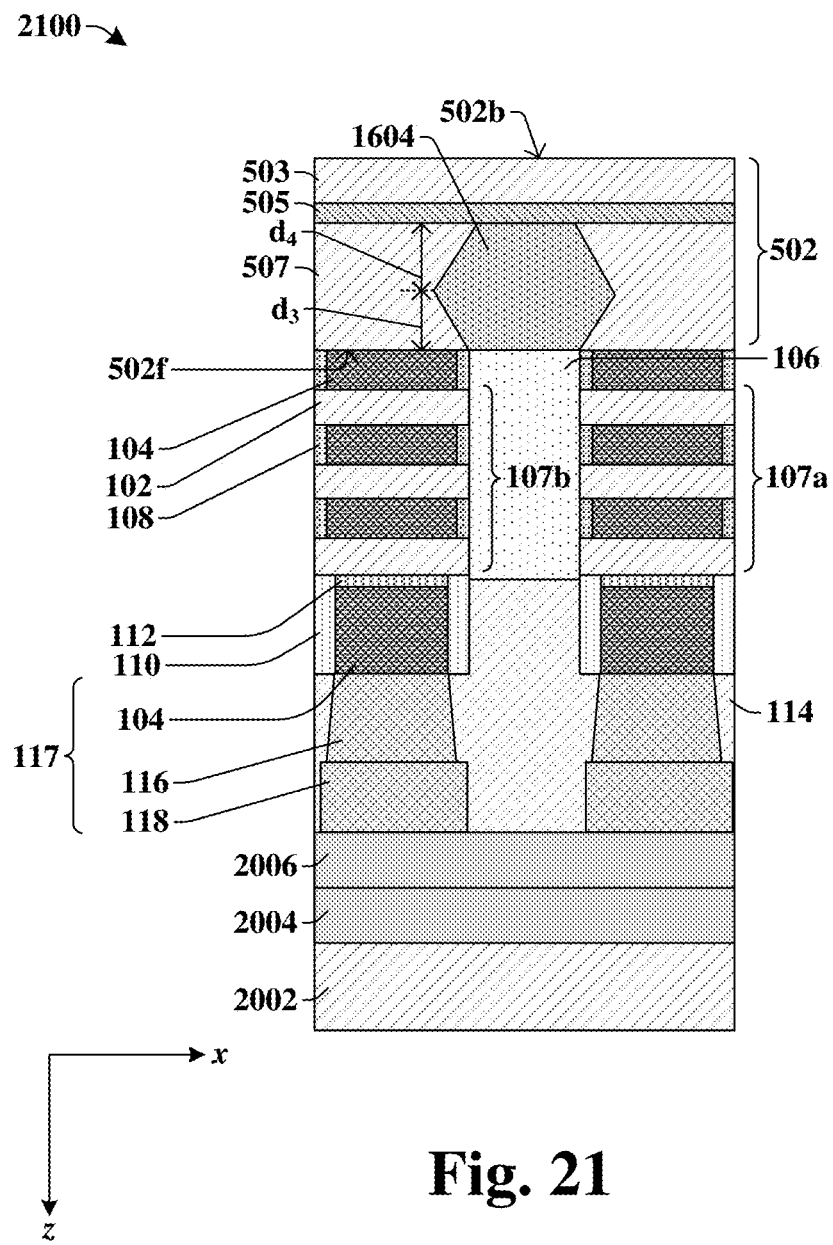

As shown in cross-sectional view 2100 of FIG. 21, in some embodiments, the structure in the cross-sectional view 2000 of FIG. 20 is flipped such that a backside 502b of the substrate 502 is facing "up" to be patterned. In such embodiments, the carrier substrate 2002 may protect the upper interconnect structure 117 from damage.

Figure 22A:
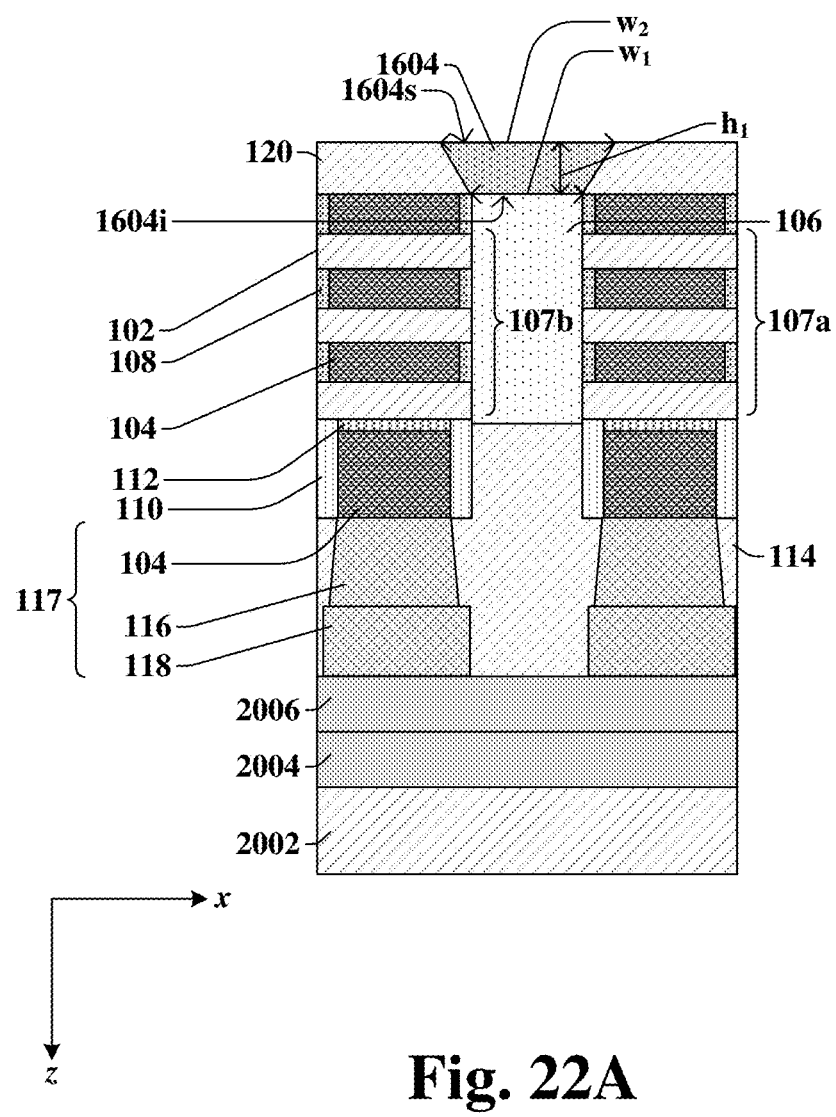

As shown in cross-sectional view 2200A of FIG. 22A, in some embodiments, a thinning process is performed on the backside (502b of FIG. 21) of the substrate (502 of FIG. 21) to remove portions of the substrate (e.g., 503, 505 of substrate 502 of FIG. 21) and the dummy source/drain material 1604 to expose a surface 1604s of the dummy source/drain material 1604. In some embodiments, the thinning process comprises a planarization process such as, for example, chemical mechanical planarization (CMP). In some embodiments, after the exposure of the surface 1604s of the dummy source/drain material 1604, the substrate (e.g., 507 of substrate 502 of FIG. 21) is removed by a removal process and replaced by a lower interconnect dielectric structure 120. In some embodiments, the lower interconnect dielectric structure 120 may be formed by a deposition process (e.g., PVD, CVD, PE-CVD, ALD, etc.) and may comprise, for example, a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like. In some embodiments, the upper interconnect dielectric structure 114 may be formed by way of a deposition process (e.g., PVD, CVD, PE-CVD, ALD, etc.). In some embodiments, the dummy source/drain material is substantially resistant to removal by the removal process used to remove the substrate (502 of FIG. 21).

In some embodiments, the exposed surface 1604s of the dummy source/drain material 1604 has a second width $w_2$ that is a maximum width of the dummy source/drain material 1604 in FIG. 22A. In some embodiments, the second width $w_2$ of FIG. 22A is less than or equal to a maximum value of the variable width (1104w of FIG. 11A) of the cavity (1104 of FIG. 11A) previously formed in FIG. 11A. In some embodiments, an interface 1604i between the dummy source/drain material 1604 has a first width $w_1$ that is a minimum width of the dummy source/drain material 1604. Further, in such embodiments, a width of the dummy source/drain material 1604 of FIG. 22A continuously decreases as the width is measured from the exposed surface 1604s to the interface 1604i. Thus, in some embodiments, the thinning process of FIG. 22A is stopped once the width of the dummy source/drain material 1604 of FIG. 22A continuously decreases as the width is measured from the exposed surface 1604s to the interface 1604i.

Therefore, in some embodiments, the dummy source/drain material 1604 has a first height $h_1$ measured in the z-direction that is less than or equal to the third distance ($d_3$ of FIG. 21). Thus, the thinning process of FIG. 22A at least removes a thickness of the dummy source/drain material 1604 of FIG. 21 equal to the fourth distance ($d_4$ of FIG. 21) such that in FIG. 22A, after the thinning process, the exposed surface 1604s of the dummy source/drain material 1604 has a second width $w_2$ that is a maximum width of the dummy source/drain material 1604.

Figure 22B:
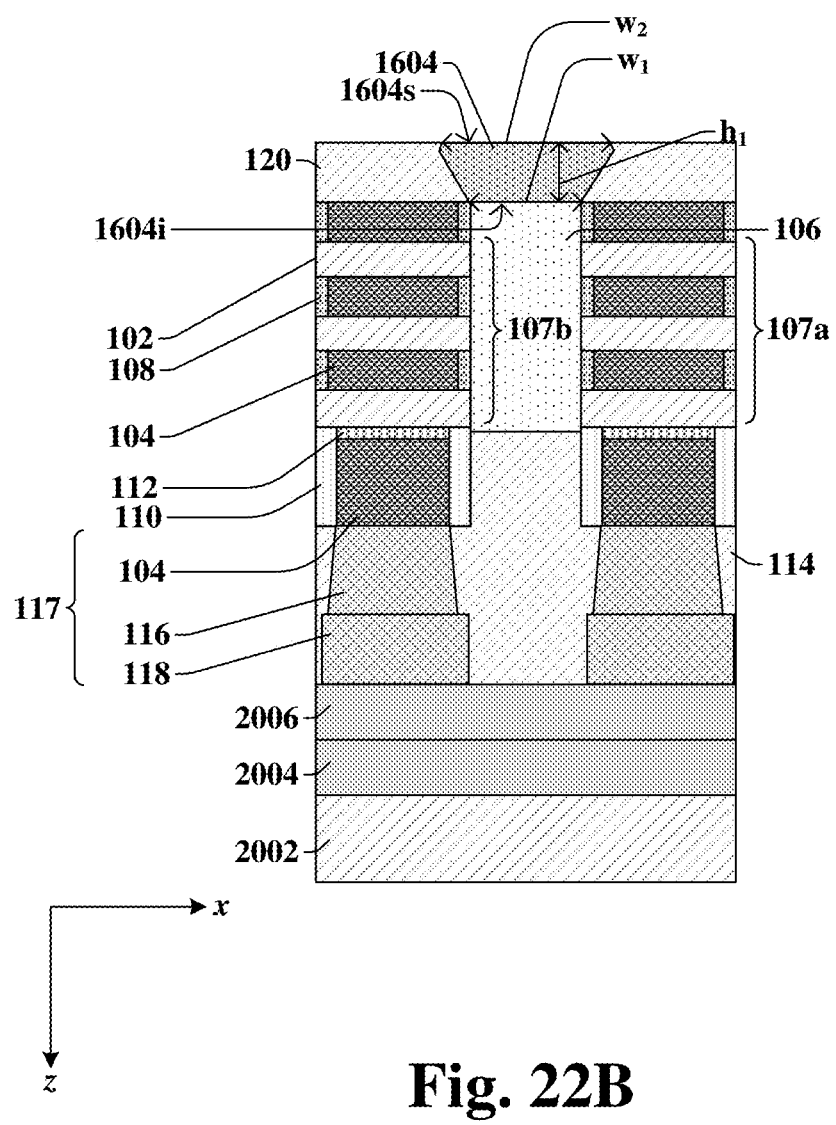

FIG. 22B illustrates a cross-sectional view 2200B of some alternative embodiments of the dummy source/drain material 1604 after the thinning process described in FIG. 22A.

Thus, in some other embodiments, the first height $h_1$ of the dummy source/drain material 1604 after the thinning process may have an exposed surface 1604s that is not a maximum width of the dummy source/drain material 1604. In such embodiments, the exposed surface 1604s of the dummy source/drain material 1604 has a second width $w_2$ that is between a maximum width and a minimum width of the dummy source/drain material 1604 in FIG. 22A. In some such embodiments, the timing of the thinning process may have been reduced such that the first height $h_1$ of the dummy source/drain material is greater than the third distance ($d_3$ of FIG. 21). In some embodiments, the thinning process may be repeated until the second width $w_2$ of the exposed surface 1604s is a maximum width of the dummy source/drain material 1604, or the method may proceed without repeating the thinning process.

Figure 23:
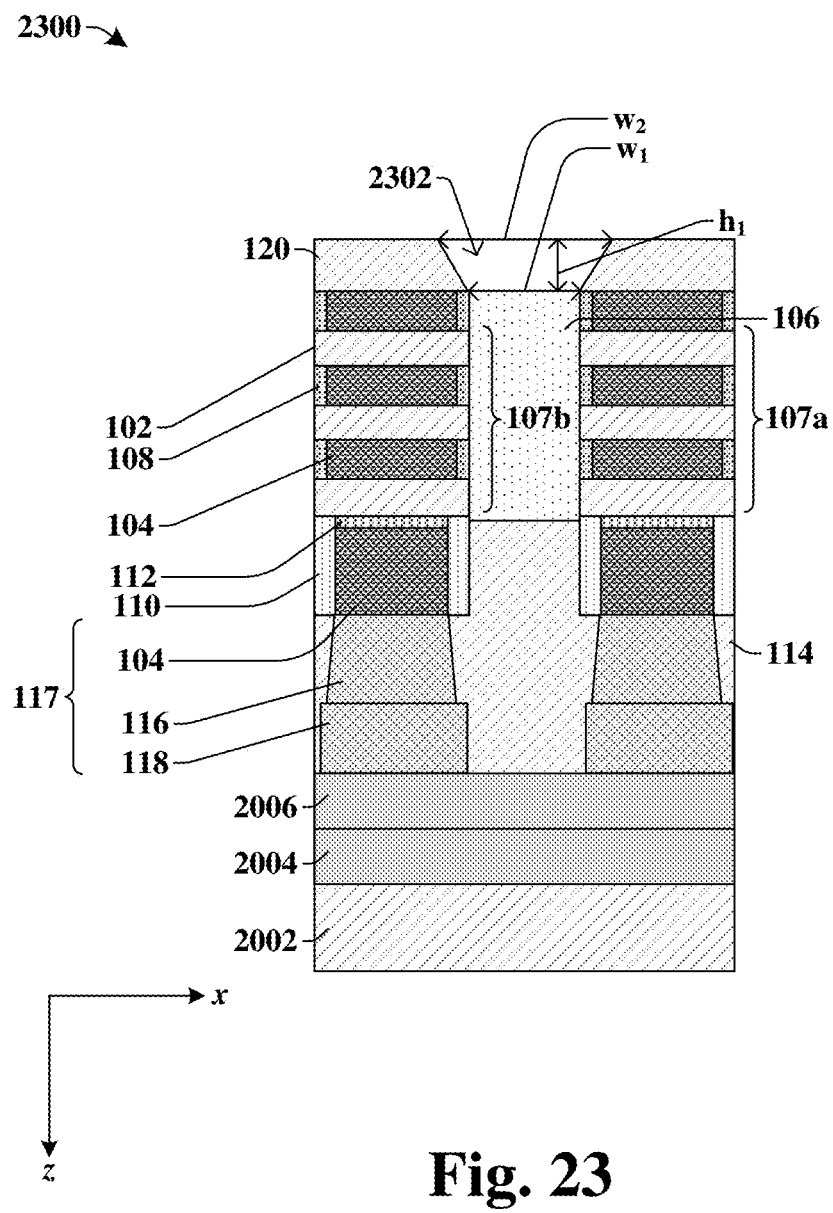

As shown in cross-sectional view 2300 of FIG. 23, which proceeds from FIG. 22A, in some embodiments, the dummy source/drain material (1604 of FIG. 22A) is removed from the source/drain region 106 thereby forming a backside opening 2302 in the lower interconnect dielectric structure 120 and over the source/drain region 106. In some embodiments, the dummy source/drain material (1604 of FIG. 22A) is removed using a wet etch or a dry etch. In some embodiments, the backside opening 2302 has a bottom surface having the first width $w_1$ and an upper surface having the second width $w_2$. Further, in some embodiments, a width of the backside opening 2302 continuously decreases as the width is measured in the z-direction from the lower interconnect dielectric structure 120 towards the upper interconnect structure 117.

Figure 24:
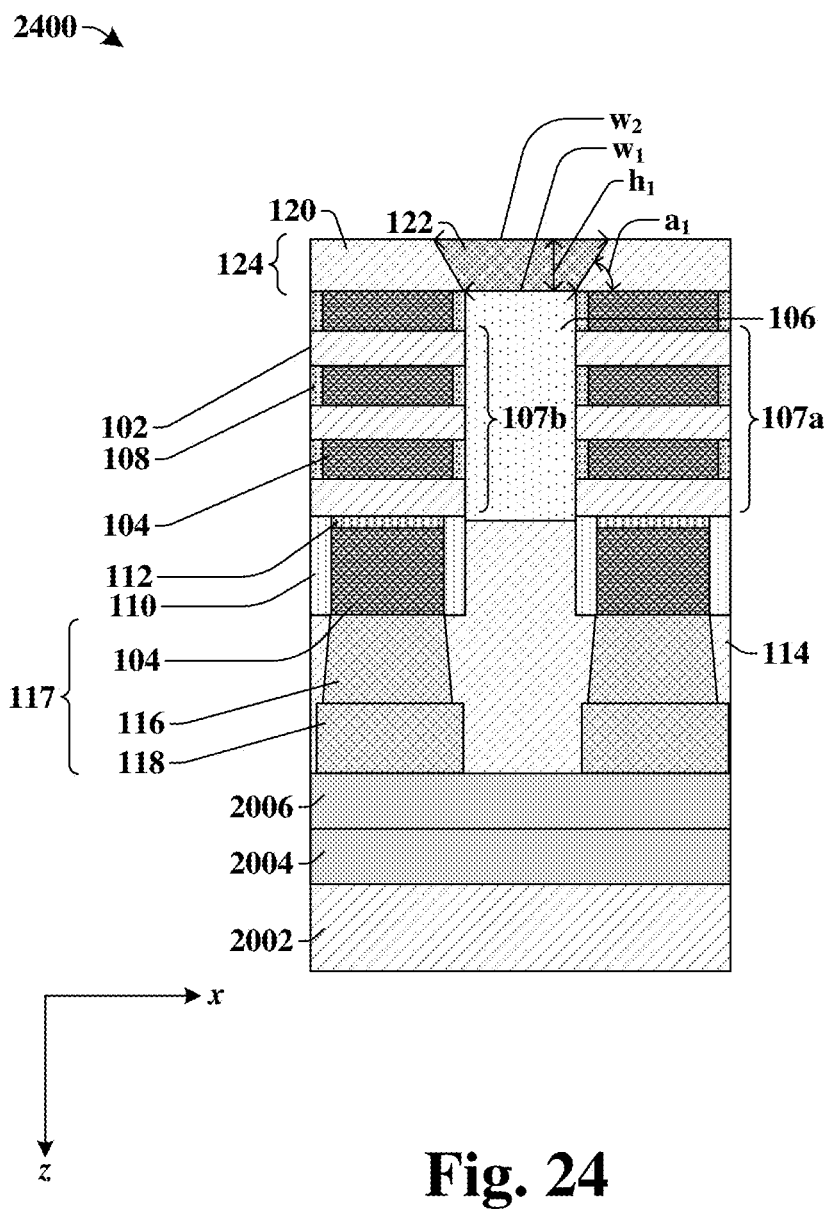

As shown in cross-sectional view 2400 of FIG. 24, in some embodiments, a conductive material is formed within the backside opening (2302 of FIG. 23) to form a backside contact 122 coupled to the source/drain region 106 and surrounded by the lower interconnect dielectric structure 120. In some embodiments, the backside contact 122 is formed by way of a deposition process (e.g., PVD, CVD, PE-CVD, ALD, sputtering, etc.) followed by a removal process (e.g., CMP) such that the backside contact 122 has surfaces that are substantially co-planar with the lower interconnect dielectric structure 120. In some embodiments, the backside contact 122 comprises a conductive material such as, for example, tungsten, ruthenium, aluminum, copper, or some other suitable conductive material.

Thus, in some embodiments, a lower interconnect structure 124 comprising the backside contact 122 and the lower interconnect dielectric structure 120 is arranged on a backside of a transistor device, such as an NSFET, as illustrated in the cross-sectional view 2400 of FIG. 24. In some embodiments, the first angle $a_1$ being acute allows for the backside contact 122 to have a width that continuously decreased as the width was measured in the z-direction from the lower interconnect dielectric structure 120 towards the upper interconnect structure 117. If the first angle $a_1$ were obtuse, the width would increase as the width was measured in the z-direction from the lower interconnect dielectric structure 120 towards the upper interconnect structure 117. In some embodiments, the first angle $a_1$ is based on the angle between the [111] planes and the [100] planes of the substrate 502. In some embodiments, the first angle $a_1$ is in a range of between, for example, approximately 50 degrees and 60 degrees. In some embodiments, one half of a difference between the first and second widths $w_1$, $w_2$ (i.e., $\frac{1}{2}(w_2-w_1)$) is equal to the first height $h_1$ divided by the tangent of the first angle $a_1$ (i.e., $h_1/(\tan(a_1))$). For example, in some embodiments, the first angle $a_1$ may equal 54.7 degrees. In such embodiments, the first height $h_1$ may equal $1.41(\frac{1}{2}(w_2-w_1))$ because the tangent of 54.7 degrees is about equal to 1.41.

Because the backside opening (2302 of FIG. 23) had a width that continuously decreased as the width was measured in the z-direction from the lower interconnect dielectric structure 120 towards the upper interconnect structure 117, the backside contact 122 was formed within the backside opening (2302 of FIG. 23) without or with mitigated voids and seams. This way, the backside contact 122 has a reduced number of defects which increases the reliability of the overall NSFET. Further, in such embodiments, by utilizing the frontside and the backside of the NSFET, the device density of the overall device is increased.

Figure 25:
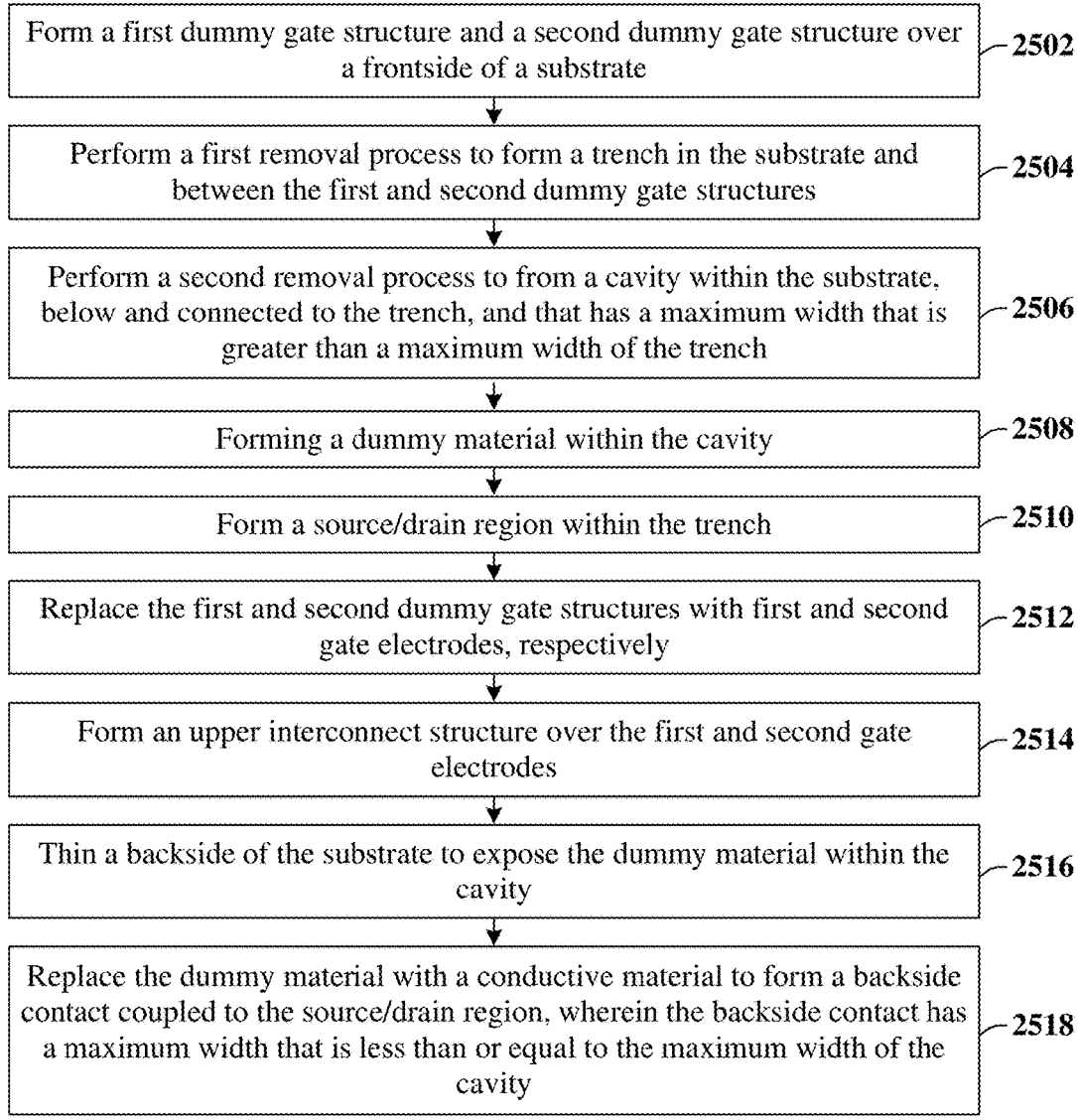
FIG. 25 illustrates a flow diagram of some embodiments corresponding to the method of FIGS. 5A-24.

FIG. 25 illustrates a flow diagram of some embodiments of a method 2500 corresponding to the method of forming an NSFET or a finFET with a backside contact coupled to a source/drain region as illustrated in FIGS. 5A-24.

While method 2500 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2502, a first dummy gate structure and a second dummy gate structure are formed over a frontside of a substrate. FIG. 6 illustrates a cross-sectional view 600 of some embodiments corresponding to act 2502.

At act 2504, a first removal process is performed to form a trench in the substrate and between the first and second dummy gate structures. FIGS. 8A and 8B respectively illustrate cross-sectional views 800A and 800B of some embodiments corresponding to act 2504.

At act 2506, a second removal process is performed to from a cavity within the substrate, below and connected to the trench, and that has a maximum width that is greater than a maximum width of the trench. FIGS. 11A and 11B respectively illustrate cross-sectional views 1100A and 1100B of some embodiments corresponding to act 2506.

At act 2508, a dummy material is formed within the cavity.

At act 2510, a source/drain region is formed within the trench. FIG. 16 illustrates a cross-sectional view 1600 of some embodiments corresponding to acts 2508 and 2510.

At act 2512, the first and second dummy gate structures are replaced by first and second gate electrodes, respectively. FIG. 18 illustrates a cross-sectional view 1800 of some embodiments corresponding to act 2512.

At act 2514, an upper interconnect structure is formed over the first and second gate electrodes. FIG. 19 illustrates a cross-sectional view 1900 of some embodiments corresponding to act 2514.

At act 2516, a backside of the substrate is thinned to expose the dummy material within the cavity. FIG. 22A illustrates a cross-sectional view 2200A of some embodiments corresponding to act 2516.

At act 2518, the dummy material is replaced with a conductive material to form a backside contact coupled to the source/drain region, wherein the backside contact has a maximum width that is less than or equal to the maximum width of the cavity. FIG. 24 illustrates a cross-sectional view 2400 of some embodiments corresponding to act 2518.

Therefore, the present disclosure relates to a method of forming a backside contact on a source/drain region of a transistor by using a wet etch such that the backside contact has a width that continuously decreases from a bottommost surface to a topmost surface of the backside contact to mitigate defects of the backside contact.

Accordingly, in some embodiments, the present disclosure relates to an integrated chip comprising: a channel structure extending between a first source/drain region and a second source/drain region; a gate electrode arranged directly over the channel structure; an upper interconnect contact arranged over and coupled to the gate electrode; and a backside contact arranged below and coupled to the first source/drain region, wherein the backside contact has a width that continuously decreases as its measured at different heights from a bottommost surface of the backside contact to a topmost surface of the backside contact.

In other embodiments, the present disclosure relates to an integrated chip comprising: a channel structure extending between a first source/drain region and a second source/drain region; a gate electrode arranged directly over the channel structure; an upper interconnect contact arranged over and coupled to the gate electrode; and a first backside contact arranged below and coupled to the first source/drain region, wherein a bottommost surface of the first backside contact has a first width, wherein a topmost surface of the first backside contact has a second width, wherein the first width is a maximum width of the first backside contact, and wherein the second width is a minimum width of the first backside contact.

In yet other embodiments, the present disclosure relates to a method comprising: forming a first dummy gate structure and a second dummy gate structure over a frontside of a substrate; performing a first removal process to form a trench by removing portions of the substrate according to the first and second dummy gate structures, wherein the trench defines a first channel structure underlying the first dummy gate structure and a second channel structure underlying the second dummy gate structure; performing a second removal process to form a cavity within the substrate, wherein the cavity is arranged below the first and second channel structures, wherein the cavity has a first width that is greater than a second width of the trench, wherein the first width is a maximum width of the cavity, and wherein the second width is a maximum width of the trench; forming a dummy material within the cavity; forming a source/drain region within the trench; replacing the first and second dummy gate structures with first and second gate electrodes, respectively; forming an upper interconnect structure over the first and second gate electrodes; thinning a backside of the substrate to expose the dummy material within the cavity; and replacing the dummy material with a conductive material to form a backside contact coupled to the source/drain region, wherein the backside contact has a maximum width that is less than or equal to the first width of the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip comprising:
   a first source/drain region;
   a second source/drain region spaced apart from the first source/drain region;
   a channel structure extending between the first source/drain region and the second source/drain region;
   a gate electrode arranged over the channel structure;
   a first backside contact arranged below and coupled to the first source/drain region;
   a backside dielectric extending laterally from a sidewall of the first backside contact and covering an entire lower surface of the second source/drain region; and
   a first upper interconnect contact arranged over and coupled to the second source/drain region.

2. The integrated chip of claim 1, further comprising:
   a second upper interconnect contact arranged over and coupled to the gate electrode.

3. The integrated chip of claim 1, wherein the channel structure comprises a plurality of nanosheet channel structures stacked over one another, the plurality of nanosheet channel structures extending in parallel with one another between the first source/drain region and the second source/drain region.

4. The integrated chip of claim 3, wherein the gate electrode comprises a plurality of gate regions that are disposed above and below the plurality of nanosheet channel structures, respectively.

5. The integrated chip of claim 1, wherein the first backside contact is arranged in a lower interconnect dielectric structure, and wherein the channel structure comprises a fin structure, wherein the fin structure continuously extends between the lower interconnect dielectric structure and the gate electrode.

6. The integrated chip of claim 1, wherein the first backside contact has outermost sidewalls that are substantially planar.

7. The integrated chip of claim 1, wherein the first backside contact has outermost sidewalls that are curved.

8. An integrated chip comprising:
   a first source/drain region;
   a second source/drain region spaced apart from the first source/drain region;
   a channel structure extending between the first source/drain region and the second source/drain region;
   a gate electrode arranged over the channel structure;
   a first upper interconnect contact arranged over and coupled to the gate electrode; and
   a backside contact arranged below and electrically coupled to the first source/drain region; and
   wherein an upper surface of the first source/drain region and an upper surface of the second source/drain region nearest the first upper interconnect contact are co-planar with one another and are co-planar with an upper surface of the channel structure.

9. The integrated chip of claim 8, wherein the first upper interconnect contact has a width that increases from a bottommost surface of the first upper interconnect contact to a topmost surface of the first upper interconnect contact.

10. The integrated chip of claim 8, further comprising:
    a second upper interconnect contact arranged over and coupled to the second source/drain region.

11. The integrated chip of claim 10, wherein the second upper interconnect contact has a width that decreases from a topmost surface of the second upper interconnect contact to a bottommost surface of the second upper interconnect contact.

12. The integrated chip of claim 8, wherein the channel structure comprises a plurality of nanosheet channel structures stacked over one another, the plurality of nanosheet channel structures extending in parallel with one another between the first source/drain region and the second source/drain region.

13. The integrated chip of claim 12, wherein the gate electrode comprises a plurality of gate regions that are disposed above and below the plurality of nanosheet channel structures, respectively.

14. An integrated chip comprising:
- a first source/drain region;
- a second source/drain region spaced apart from the first source/drain region;
- a channel structure extending between the first source/drain region and the second source/drain region;
- a gate electrode arranged over the channel structure;
- an upper interconnect contact having tapered sidewalls, the upper interconnect contact being arranged over and coupled to the first source/drain region and the upper interconnect contact being the only contact directly contacting the first source/drain region; and
- a backside contact arranged below and coupled to the second source/drain region wherein the backside contact being the only contact directly contacting the second source/drain region.

15. The integrated chip of claim 14, wherein the upper interconnect contact has a width that increases from a bottommost surface of the upper interconnect contact to a topmost surface of the upper interconnect contact.

16. The integrated chip of claim 14, wherein the upper interconnect contact is coupled to the first source/drain region and further comprising:
- an additional upper interconnect contact arranged over and coupled to the gate electrode.

17. The integrated chip of claim 16, wherein the additional upper interconnect contact has a width that decreases from a topmost surface of the additional upper interconnect contact to a bottommost surface of the additional upper interconnect contact.

18. The integrated chip of claim 14, wherein the channel structure comprises a plurality of nanosheet channel structures stacked over one another, the plurality of nanosheet channel structures extending in parallel with one another between the first source/drain region and the second source/drain region.

19. The integrated chip of claim 18, wherein the gate electrode comprises a plurality of gate regions that are disposed above and below the plurality of nanosheet channel structures, respectively.

20. The integrated chip of claim 14, further comprising:
- a backside dielectric extending laterally from a sidewall of the backside contact and covering an entire lower surface of the first source/drain region.

* * * * *